United States Patent
Kner et al.

(10) Patent No.: US 6,321,003 B1
(45) Date of Patent: Nov. 20, 2001

(54) TUNABLE SEMICONDUCTOR LASER SYSTEM

(75) Inventors: Peter Kner, Oakland; Gabriel Li, Fremont; Philip Worland; Rang-Chen Yu, both of San Jose; Wupen Yuen, Stanford, all of CA (US)

(73) Assignee: Bandwidth9, Inc., Fremont, CA (US)

( * ) Notice: Subject to any disclaimer, the term of this patent is extended or adjusted under 35 U.S.C. 154(b) by 0 days.

(21) Appl. No.: 09/686,129

(22) Filed: Oct. 10, 2000

Related U.S. Application Data

(62) Division of application No. 09/326,010, filed on Jun. 4, 1999, now Pat. No. 6,181,717.

(51) Int. Cl.$^7$ .................................................. G02B 6/28
(52) U.S. Cl. .......................... 385/24; 372/6; 372/32; 372/20; 372/34; 372/38; 385/42; 385/15; 385/31; 359/115
(58) Field of Search ...................... 385/24, 15, 16, 385/17, 31, 46, 32, 47; 372/6, 32, 34, 38; 359/117, 115, 127, 124, 128, 130

(56) References Cited

U.S. PATENT DOCUMENTS

| | | | |
|---|---|---|---|
| 5,301,201 | 4/1994 | Dutta et al. | 372/43 |
| 5,629,951 | 5/1997 | Chang-Hasnain et al. | 372/20 |
| 6,181,717 | * 1/2001 | Kner et al. | 372/20 |
| 6,226,425 | * 5/2001 | Chang-Hasnain et al. | 385/24 |
| 6,233,263 | * 5/2001 | Chang-Hasnain et al. | 37/32 |

FOREIGN PATENT DOCUMENTS

| | | | |
|---|---|---|---|
| 0 818 857 A1 | 1/1998 | (EP) | H01S/1/00 |
| 0 421 674 A2 | 4/1991 | (EP) | H01S/3/096 |
| 0 570 243 A1 | 11/1993 | (EP) | H01S/3/139 |

OTHER PUBLICATIONS

Wittke et al., "Stabilization of CW Injection Lasers", *RCA Technical Notes*, TN No. 1005, Apr. 9, 1975, 3 pages.

Mikio, Y. et al., "Circuit For Stabilizing Oscillating Wavelength of Laser Diode", *Patent Abstracts of Japan*, vol. 014, No. 163, Mar. 29, 1990 (JP 02020084, Jan. 23, 1990).

Ishii, H. et al., "Wavelength stabilisation of a three-electrode distributed Bragg reflector laser with longitudinal mode control", *Electronics Letters*, vol. 33, No. 6, Mar. 13, 1997, pp. 494–496.

* cited by examiner

*Primary Examiner*—Leon Scott, Jr.
(74) *Attorney, Agent, or Firm*—Wilson Sonsini Goodrich & Rosati

(57) ABSTRACT

A multiplexer for a wavelength division multiplexed optical communication system includes an optical circulator with at least first, second, third and fourth circulator ports. An optical fiber with a first optical transmission path is coupled to the first circulator port and carries a wavelength division multiplexed optical signal that includes signals $_{1-n}$. A second optical transmission path is in optical communication with the second circulator port. A first laser is coupled to the second optical transmission path. The first laser reflects the $_{1-n}$ signals and adds a signal $_{n+1}$. A control loop is coupled to the first laser. In response to a detected change in temperature the control loop sends a signal to adjust a voltage or current supplied to the first laser and provide a controlled frequency and power of an output beam. A third optical transmission path is in optical communication with the third circulator port and transmits the signals $_{1-n}$ and the signals $_{n+1}$ that are received from the optical circulator. A fourth optical transmission path is in optical communication with the fourth optical circulator port. The fourth optical transmission path is positioned after the second optical transmission path and before the third optical transmission path. A first optoelectronic device is coupled to the fourth optical transmission path.

16 Claims, 24 Drawing Sheets

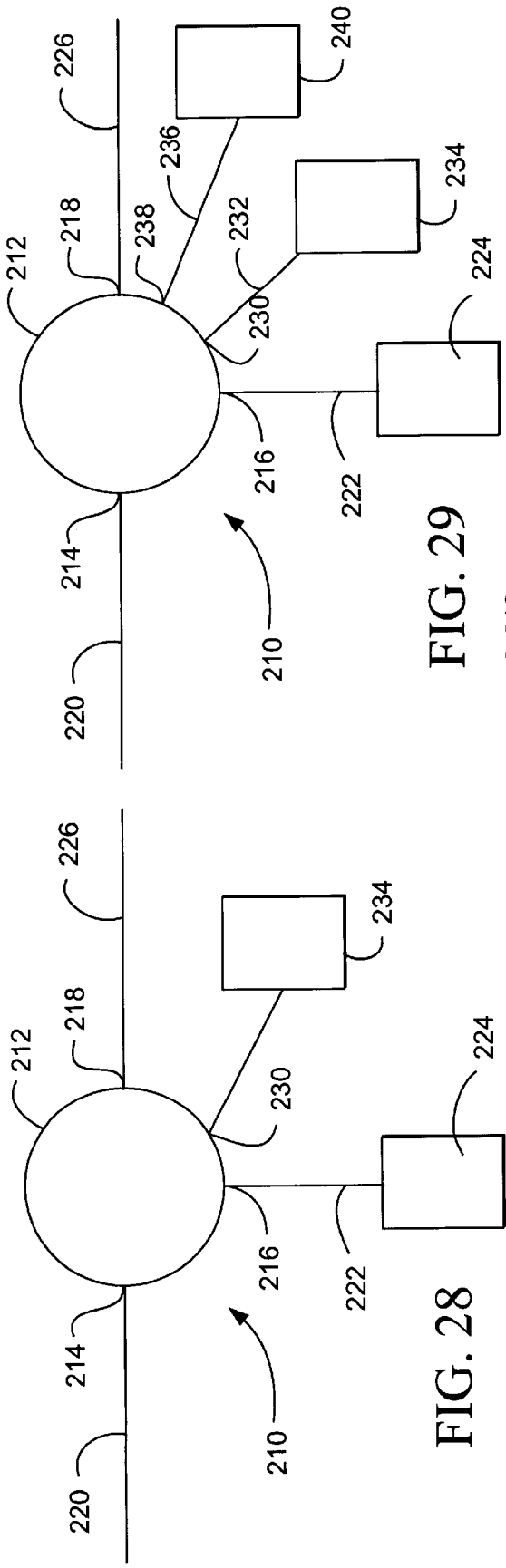
FIG. 28
FIG. 29
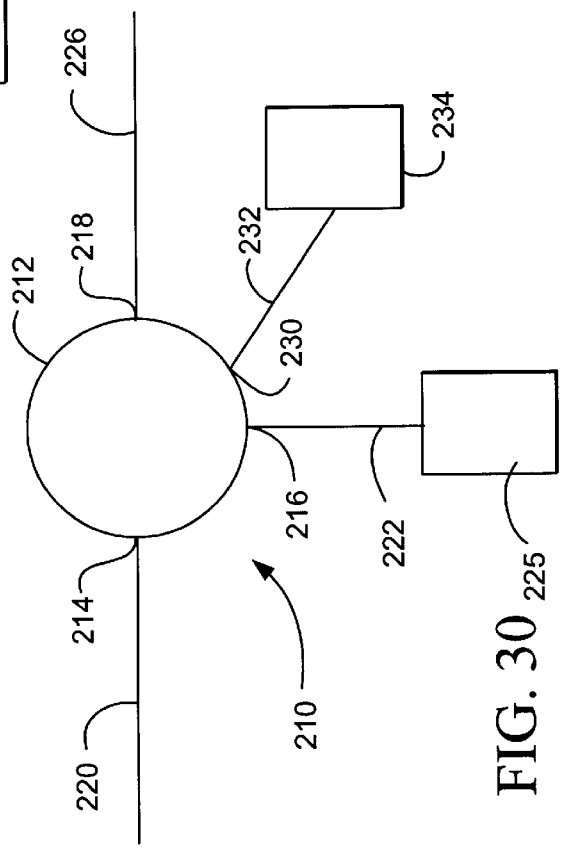
FIG. 30

TUNABLE SEMICONDUCTOR LASER SYSTEM

Reference to Related Applications

This application is a divisional of Ser. No. 09/326,010 filed Jun. 04, 1999, now U.S. Pat. No. 6,181,717 which application is fully incorporated by reference herein.

BACKGROUND OF THE INVENTION

1. Field of the Invention

This invention relates generally to semiconductor lasers, and more particularly to a semiconductor laser diode system with a control loop that provides a controlled output beam of selected wavelength in response to a changes in temperature of the diode or changes in output beam wavelength.

2. Description of Related Art

There are stringent requirements on the stability of the output wavelength and the output power of semiconductor laser units used for optical communication, and specifically for dense wave division multiplexing (DWDM). Typically, the lasers used for these applications are distributed feedback (DFB) semiconductor lasers. At fixed driving current, the output power and wavelength of these devices varies strongly with temperature. Typically the wavelength change is 0.6 A/1C. Over an operating range of 0 to 75 degrees Celsius, this wavelength change is 4.5 nm. In DWDM systems the channel spacing is 0.8 nm or 0.4 nm so this wavelength variation is unacceptable. In addition, aging of the laser will also cause a change in wavelength. To overcome this problem DFB lasers are packaged with a temperature sensor and a cooler which operate in a closed loop to maintain the laser at a fixed temperature. At a fixed temperature the laser wavelength variation is minimized. Thermal control systems used with laser diodes have included the combination of a photodiode, thermoelectric cooler and thermistor. The photodiode receives a portion of the output of the diode laser. The output from the laser diode is stabilized by a feedback drive circuit and a reference adjust variable resistor. A temperature feedback circuit uses a thermistor and the reference adjust resistor to provide feedback stabilization of the laser diode temperature.

U.S. Pat. No. 5,602,860 discloses a cooling system for a laser diode that includes a temperature sensitive switch. When a temperature exceeds a given temperature the switch is open.

Coupled to the switch is a thermoelectric cooler that cools the laser diode.

To provide more precise control of the wavelength, the wavelength can be monitored. U.S. Pat. No. 5,867,513 discloses a semiconductor laser unit in which the temperature is controlled in a closed loop which monitors the output wavelength of the laser.

Thermoelectric coolers generally require larger, more expensive power supplies than would otherwise be used. The use of thermoelectric coolers has proven to waste a significant amount of power from the power source. In one device, one or more voltage regulators are used to regulate the power supplied to a thermoelectric cooler. The power used by the voltage regulator is wasted. In addition the thermoelectric cooler itself adds to the cost of manufacturing the laser. U.S. Pat. No. 5,387,974 discloses one embodiment of a temperature insensitive wavelength meter and wavelength compensation for a KrF excimer laser as a method of avoiding the use of costly temperature control. Excimer lasers produce light in the UV wavelength range and are not appropriate for communications applications.

There is a need for a passively cooled wavelength stabilized laser system suitable for use in WDM communication applications and systems.

SUMMARY OF THE INVENTION

Accordingly, an object of the present invention is to provide a laser system.

Another object of the present invention is to provide a wavelength stabilized laser.

A further object of the present invention is to provide a passively cooled wavelength stabilized laser system.

Yet another object of the present invention is to provide a passively cooled wavelength stabilized laser system useful in WDM communications.

Another object of the present invention is to provide a DWDM device, sub-system or system that is tunable.

Yet another object of the present invention is to provide a DWDM device, sub-system or system that is programmably tunable.

A further object of the present invention is to provide a DWDM device, sub-system or system that is flexible and provides for different configuration, different levels of filtration as well as different combinations of wavelengths that are multiplexed and de-multiplexed.

Still another object of the present invention is to provide a tunable DWDM device with one or more filters to reduce crosstalk.

Another object of the present invention is to provide a position independent method and device for combining or separating many wavelengths into or from a single optical fiber.

Yet another object of the invention is to provide a wavelength tunable variable optical tap.

Another object of the invention is to provide a drop and continue network node.

These and other objects of the present invention are achieved in a multiplexer for a wavelength division multiplexed optical communication system. The system includes an optical circulator with at least first, second, third and fourth circulator ports. An optical fiber with a first optical transmission path is coupled to the first circulator port and carries a wavelength division multiplexed optical signal that includes signals $_{1-n}$. A second optical transmission path is in optical communication with the second circulator port. A first laser is coupled to the second optical transmission path. The first laser reflects the $_{1-n}$ signals and adds a signal $_{n+1}$. A control loop is coupled to the first laser. In response to a detected change in temperature the control loop sends a signal to adjust a voltage or current supplied to the first laser and provide a controlled frequency and power of an output beam. A third optical transmission path is in optical communication with the third circulator port and transmits the signals $_{1-n}$ and the signals $_{n+1}$ that are received from the optical circulator. A fourth optical transmission path is in optical communication with the fourth optical circulator port. The fourth optical transmission path is positioned after the second optical transmission path and before the third optical transmission path. A first optoelectronic device is coupled to the fourth optical transmission path.

In another embodiment of the present invention, a multiplexer for a wavelength division multiplexed optical communication system includes a first optical circulator with at least first, second and third circulator ports. An optical fiber with a first optical transmission path is coupled to the first circulator port and carries a wavelength division multiplexed optical signal that includes $_{1-n}$ signals. A second optical transmission path is in optical communication with the second circulator port. A first laser is in optical communication with the second optical transmission path. A control loop is coupled to the first laser. In response to a detected change in temperature, the control loop sends a signal to adjust a voltage or current supplied to the first laser and provide a controlled frequency and power of an output beam. A second optical circulator is provided and has at least first, second and third circulator ports. A third optical transmission path is in optical communication with the third circulator port of the first optical circulator and the first circulator port of the second optical circulator. A rejection filter is coupled to the third optical transmission path. The rejection filter drops a signal $_1$. A fourth optical transmission path is in optical communication with the second circulator port of the second optical circulator. A first optoelectronic device is in optical communication with the fourth optical transmission path. A fifth optical transmission path is in optical communication with the third circulator port of the second optical circulator.

In another embodiment of the present invention, a multiplexer for a wavelength division multiplexed optical communication system includes a first optical circulator with at least first, second and third circulator ports. An optical fiber with a first optical transmission path is coupled to the first circulator port. The optical fiber carries a wavelength division multiplexed optical signal that includes $_{1-n}$ signals. A second optical transmission path is in optical communication with the second circulator port of the first optical circulator. A first laser is in optical communication with the second optical transmission path. The first laser adds a signal $_{n+1}$. A control loop is coupled to the first laser. In response to a detected change in temperature, the control loop sends a signal to adjust a voltage or current supplied to the first laser and provides a controlled frequency and power of an output beam. A second optical circulator includes at least first, second and third circulator ports. A third optical transmission path is in optical communication with the third circulator port of the first optical circulator and the first circulator port of the second optical circulator. A fourth optical transmission path is in optical communication with the second circulator port of the second optical circulator. A first optoelectronic device is in optical communication with the fourth optical transmission path. A fifth optical transmission path is in optical communication with the third circulator port of the second optical circulator.

In another embodiment of the present invention, a multiplexer for a wavelength division multiplexed optical communication system includes a first optical circulator with at least first, second and third circulator ports. An optical fiber with a first optical transmission path is coupled to the first circulator port. The optical fiber carries a wavelength division multiplexed optical signal that includes $_{1-n}$ signals. A second optical transmission path is in optical communication with the second circulator port of the first optical circulator. A laser is in optical communication with the second optical transmission path. The laser detects a signal $_1$, passes a portion of the signal $_1$, and reflects a first residual $_1$ signal and signals $_{2-n}$. A control loop is coupled to the laser. In response to a detected change in temperature, the control loop sends a signal to adjust a voltage or current supplied to the laser and provide a controlled frequency and power of an output beam. A second optical circulator includes at least first, second and third circulator ports. A third optical transmission path is in optical communication with the third circulator port of the first optical circulator and the first circulator port of the second optical circulator. A fourth optical transmission path is in optical communication with the second circulator port of the second optical circulator. A first optoelectronic device is in optical communication with the fourth optical transmission path. The second optoelectronic device is selected from a detector/filter and a filter. A fifth optical transmission path in optical communication with the third circulator port of the second optical circulator.

BRIEF DESCRIPTION OF THE FIGURES

FIG. 28 is a schematic diagram of multiplexer or de-multiplexer that includes a four port optical circulator and a filter that passes a portion of a signal, reflects a residual portion of the passed signal along with all other signals, as well as a second optoelectronic device coupled to the optical circulator.

FIG. 29 is a schematic diagram of the multiplexer or de-multiplexer of FIG. 28 with an additional optical circulator port, optical transmission path and a third optoelectronic device.

FIG. 30 is a schematic diagram of a multiplexer or de-multiplexer of the present invention that includes a four port optical circulator, a laser coupled to the second port and an optoelectronic device coupled to the fourth port.

DETAILED DESCRIPTION

Figure 1:
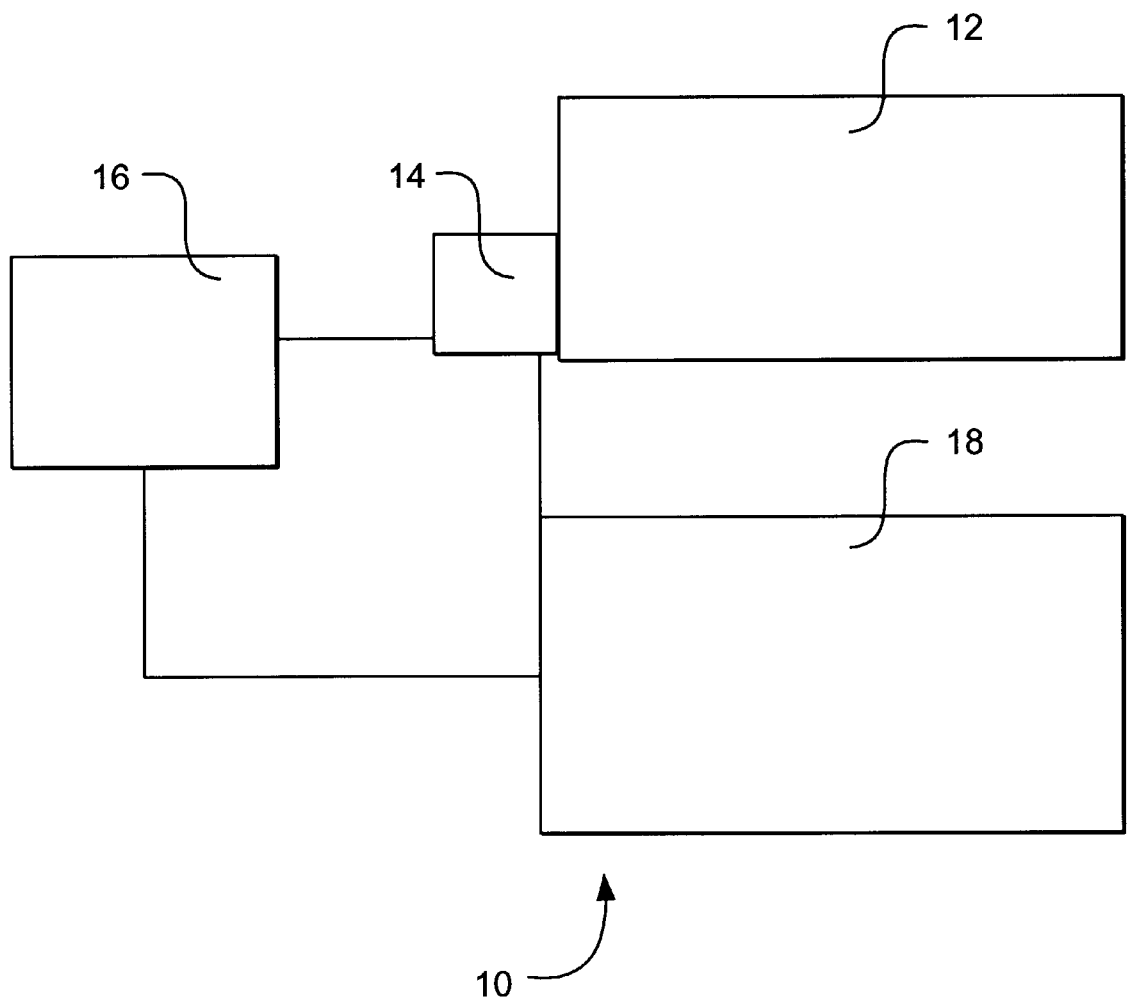
FIG. 1 is a block diagram of one embodiment of a tunable semiconductor laser system of the present invention with a wavelength tuning member and a temperature sensor.

Referring to FIG. 1, one embodiment of the present invention is a tunable semiconductor laser system is generally denoted as numeral 10 and includes a laser 12. Laser 12 is preferably tunable and generates a divergent output beam. Laser 12 can be any single mode semiconductor diode laser. Preferably, laser 12 is a vertical cavity surface emitting laser (VCSEL), an output facet of a single mode fiber (SMF) or an edge emitting laser. The output beam from laser 12 is preferably utilized for communication applications, with a wavelength in the range of 800 nm to 1650 nm.

Laser 12 has a semiconductor active region positioned between upper and lower confining regions of opposite type semiconductor material. Laser 12 also includes first and second reflectors positioned at opposing edges of the active and confining regions. A wavelength tuning member 14 and a temperature sensor 16 are each coupled to laser 12. A control loop, denoted as 18, is coupled to temperature sensor 16 and tuning member 14. In response to a detected change in temperature of laser 12, control loop 18 sends an adjustment signal to tuning member 14. Tuning member 14 adjusts either voltage or current supplied to laser 12 in order to provide a controlled output beam of a selected wavelength. System 10 does not require active cooling and is suitable for use in WDM communication systems.

Preferably, laser 12 is a tunable laser. Suitable lasers 12 include but are not limited to are 3 stage and 4 stage DFB lasers and tunable VCSEL lasers. In addition, an applied voltage or current controls the output power of the laser.

Figure 2:
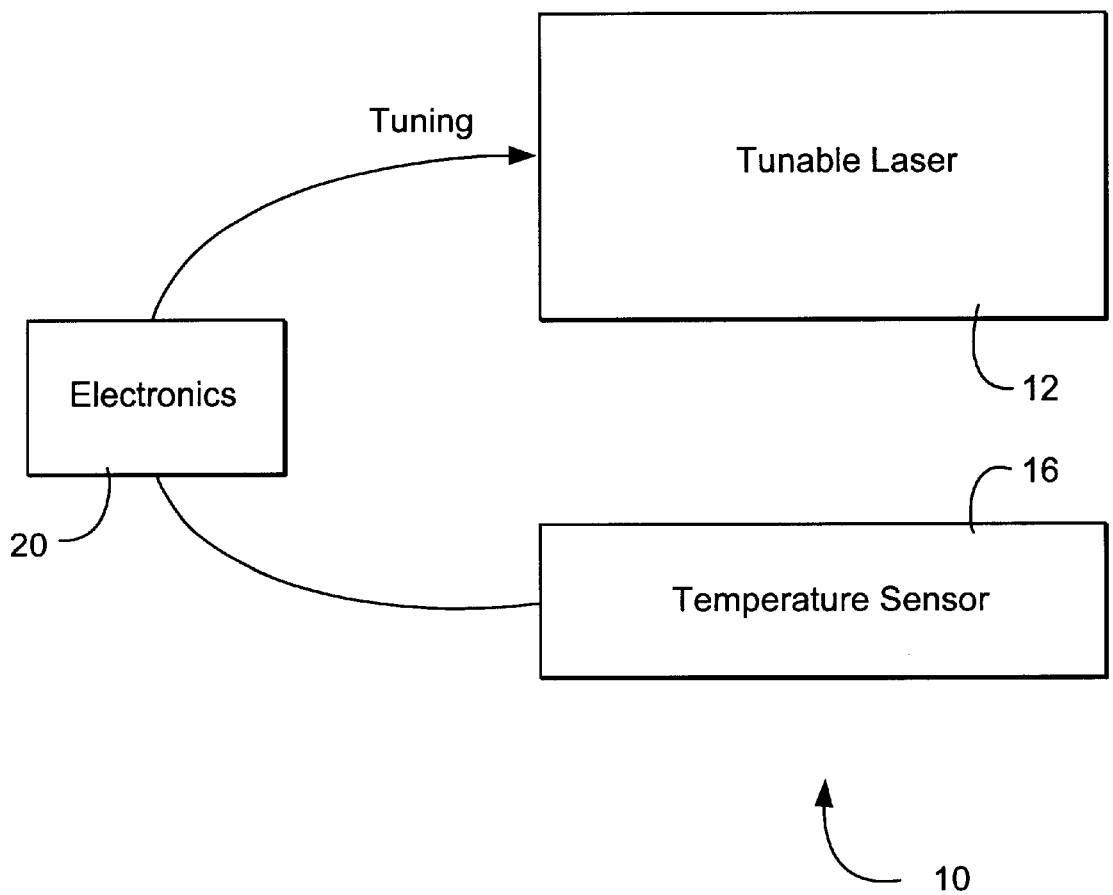
FIG. 2 is a block diagram of one embodiment of the present invention with a closed loop scheme for wavelength stabilization.

In one embodiment of system 10, illustrated in FIG. 2, only the output power and the temperature of laser 12 are measured. The output power of laser 12 is kept constant by controlling the power applied to laser 12 in a closed feedback loop. The wavelength of laser 12 is controlled in an open loop where a control circuit tunes laser 12 to correct for a calibrated wavelength drift according to the measured temperature. Electronics 20 are employed in both the open and closed feedback loops and include but are not limited to op-amplifiers, resistors, capacitors, transistors and the like.

Figure 3:
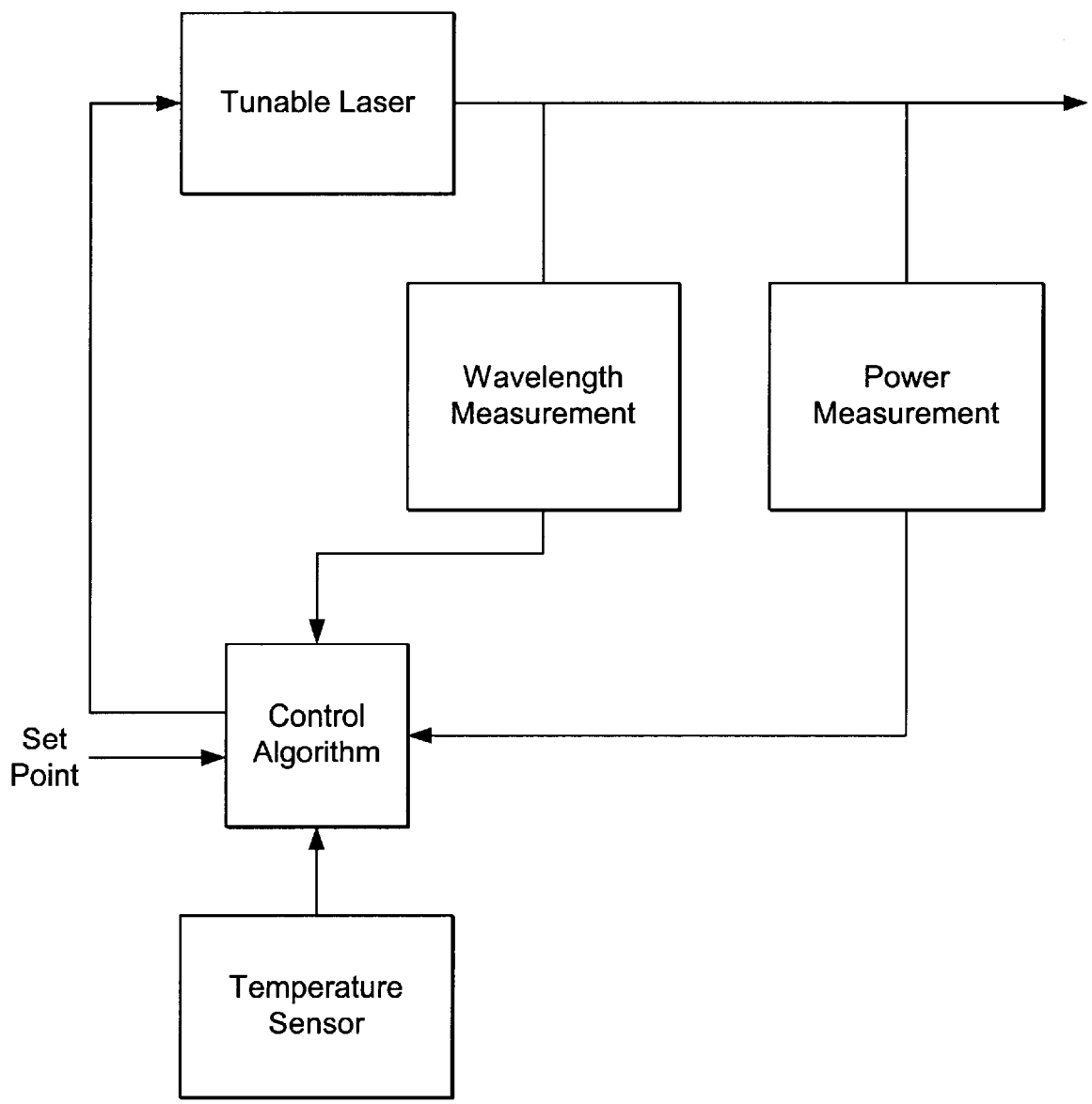
FIG. 3 is a block diagram of an embodiment of the present invention illustrating correction of a wavelength meter response with temperature in a control circuit.

In another embodiment of system 10, illustrated in FIG. 3, both the output power and the wavelength of laser 12 are measured. Closed feedback loops control both the laser power and the laser wavelength. The temperature is also measured, and the measurement is used to correct any error due to temperature in the wavelength and power measurements. The wavelength of laser 12 is stabilized in a closed feedback loop in which the wavelength of the laser output is measured. Temperature measurement is used to correct for the known temperature drift of the wavelength measurement and the power measurement.

Suitable temperature sensors 16 include but are not limited to thermistors, bipolar transistors, diode circuits and the like. Temperature sensor circuits for use with silicon CMOS technology are described in U.S. Pat. No. 5,829,879 and ACMOS-Compatible Smart Temperature Sensors@ by R. A. Bianchi et. al., Microelectronics Journal v. 29, pp. 627–636 (1998), all incorporated herein by reference.

Figure 4A:
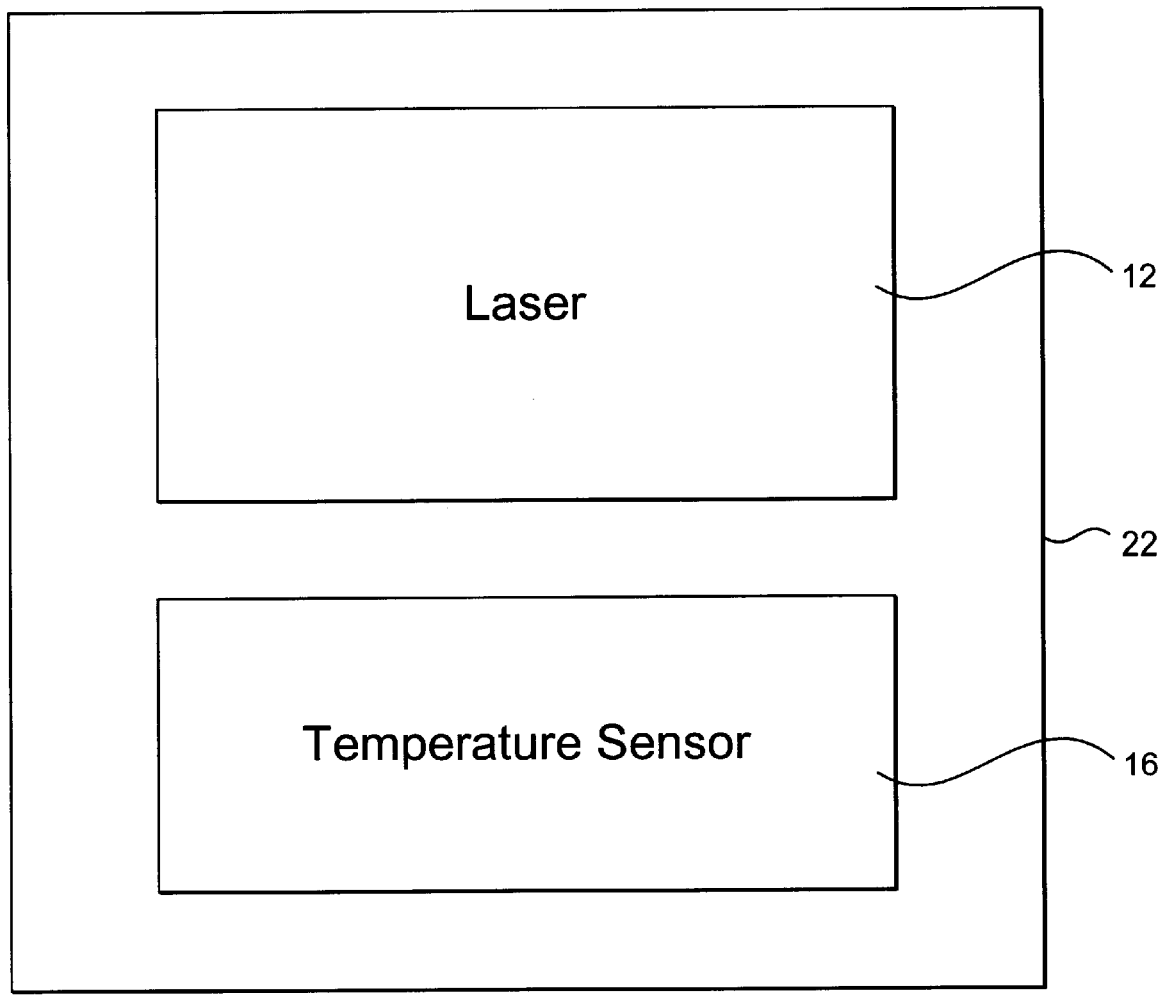
FIG. 4(a) is a schematic diagram of the tunable semiconductor laser system of FIG. 1 with the laser and temperature integrated on a chip.

Referring to FIG. 4(a), laser 12 and sensor 16, including but not limited to a transistor or diode temperature measurement circuit, can be positioned and/or formed on the same substrate or chip 22. This is particularly advantageous for surface emitting devices. Another temperature measurement technique implemented on the same chip 22 is a bimetallic cantilever. (See AMicromechanics: A Toolbox for Femtoscale Science:>Towards a Laboratory on a Tip.=@ by R. Berger et. al., Microelectronic Engineering v. 35, pp. 373–379 (1997)), incorporated herein by reference.

After system 10 is turned on, a current I is applied to laser 12 so that laser 12 produces an optical power P, and a voltage V is applied to the laser tuning mechanism so that the lasing wavelength is λ. A small fraction of the output of laser 12 is sent through a wavelength selective filter, including but not limited to a Fabry-Perot etalon and into a detector.

Figure 4B:
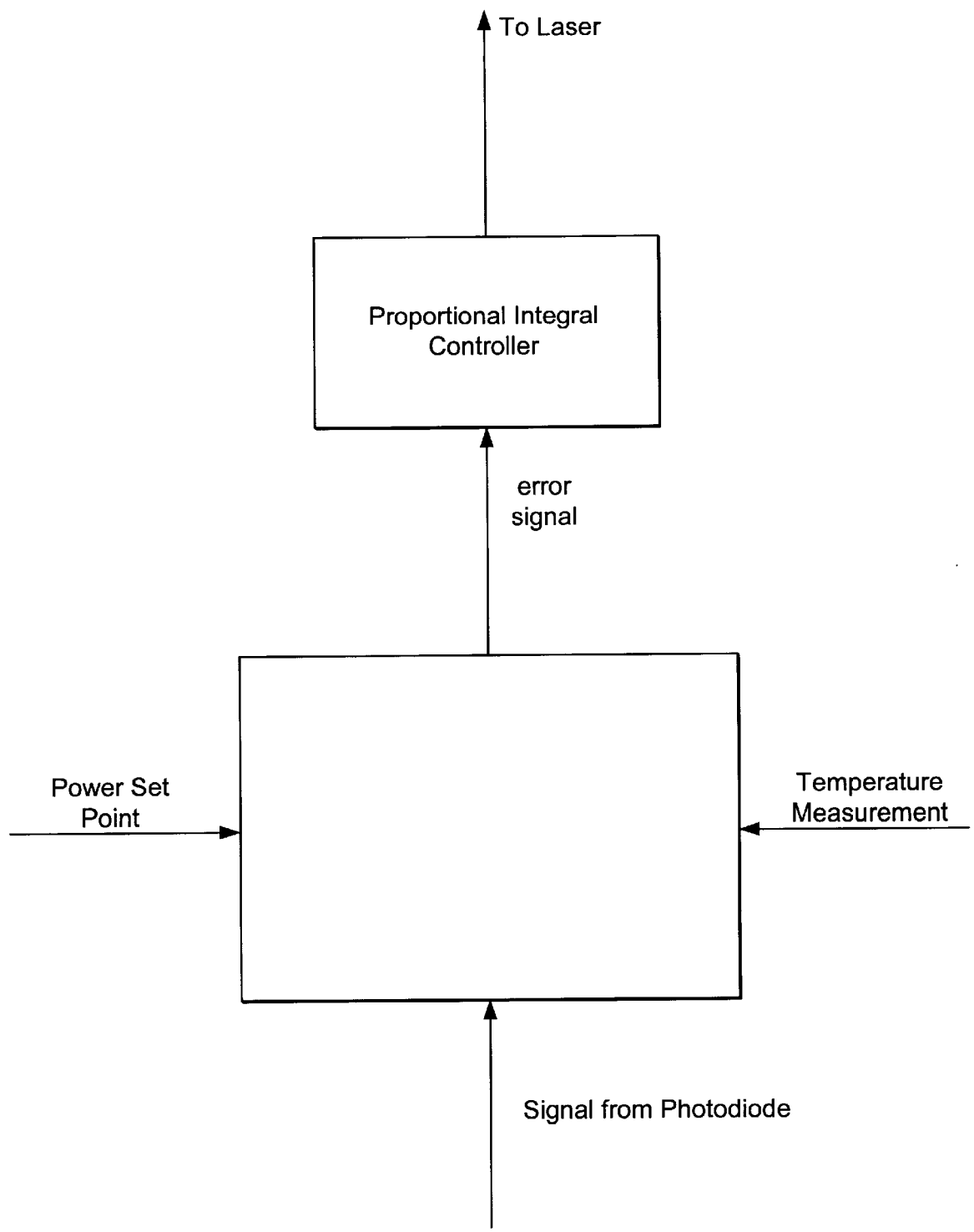
FIG. 4(b) is a block diagram illustrating an embodiment of the apparatus of FIG. 1 with the generation of an error signal when temperature correction is needed.
Figure 19A:
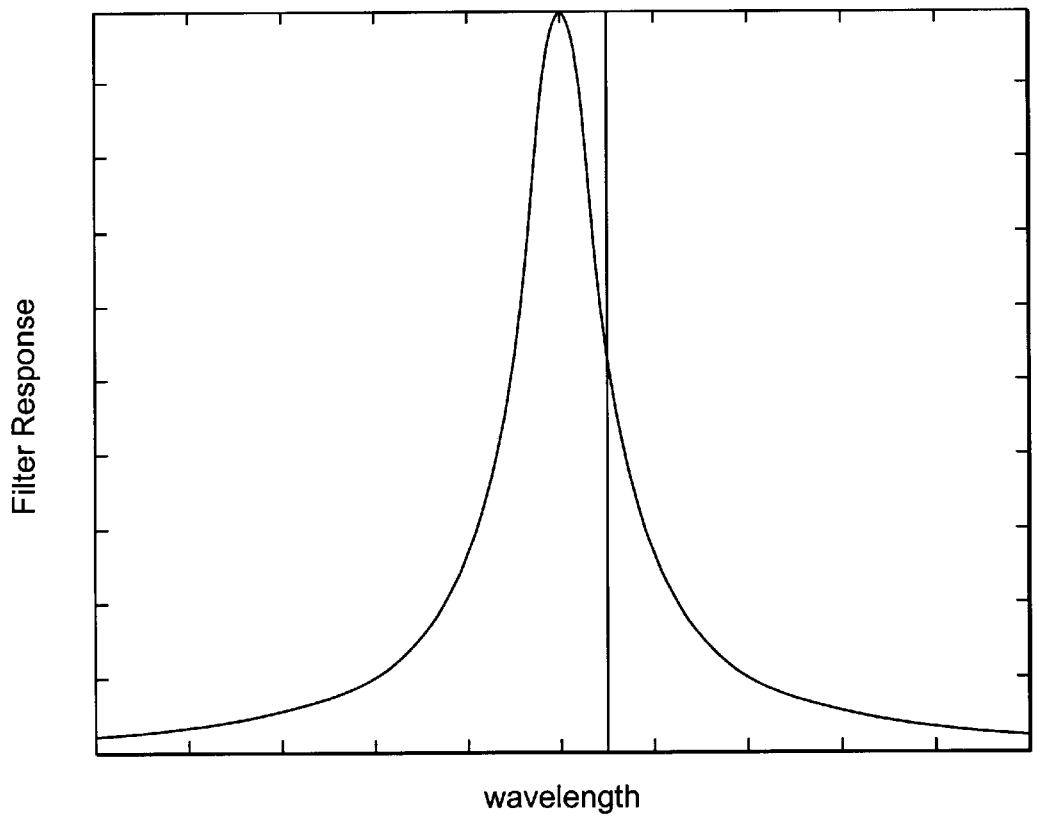
FIG. 19(a) is a graph illustrating filter transmission of an etalon.
Figure 19B:
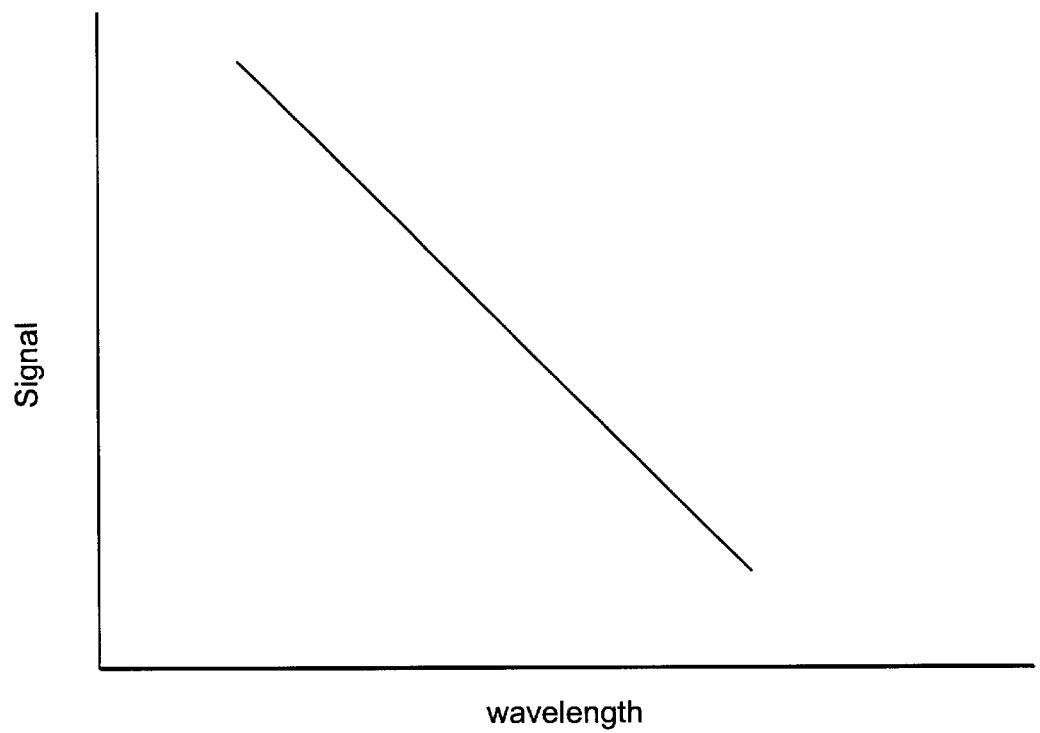
FIG. 19(b) is a graph illustrating the linear response near a targeted wavelength of the etalon of FIG. 19(a).

As illustrated in FIG. 4(b) temperature sensor 16 supplies a current or voltage proportional to the temperature which is subtracted off (or added to) the detector current to correct for the temperature drift of the Fabry-Perot etalon. The corrected detector current is compared to a set current which corresponds to a predetermined wavelength, λ0. If λ is greater than λ0, the measured detector current will be smaller than the set current, as more fully described hereafter and illustrated in FIGS. 19(a) and 19(b), and if λ is less than λ0, the measured current will be greater than the set current. The difference between the measured and set current is sent through a proportional-integral circuit which applies a voltage to tuning member 14. If λ is not equal to λ0, the voltage applied to tuning member 14 increases (or decrease) until λ equals λ0 when the input to the circuit will be 0 and the voltage will stabilize at a constant value.

In a similar manner, a small fraction of the output of laser 12 is sent directly into the detector to monitor laser 12 power. A current proportional to the temperature is subtracted off (or added to) the detector current to compensate for the change in detector response with temperature. This corrected current is then compared to a set value which corresponds to the desired output power of laser 12. The difference between the corrected detector current and the set current is sent to a proportional integral circuit which will apply a current to laser 12. If the laser power is to low, the current to laser 12 is increased by the circuit until it is at the proper value, and if the power is too high, the current is decreased.

In this way, the power and wavelength of system 10 output remains constant despite changes in the temperature.

One embodiment of laser 12 is a VCSEL with a cantilever apparatus that uses an electrostatic force that pulls on a cantilever arm. The mechanical deflection resulting from this electrostatic force is used to change the length of the laser's Fabry-Perot microcavity and consequently to the resonance wavelength.

Figure 5:
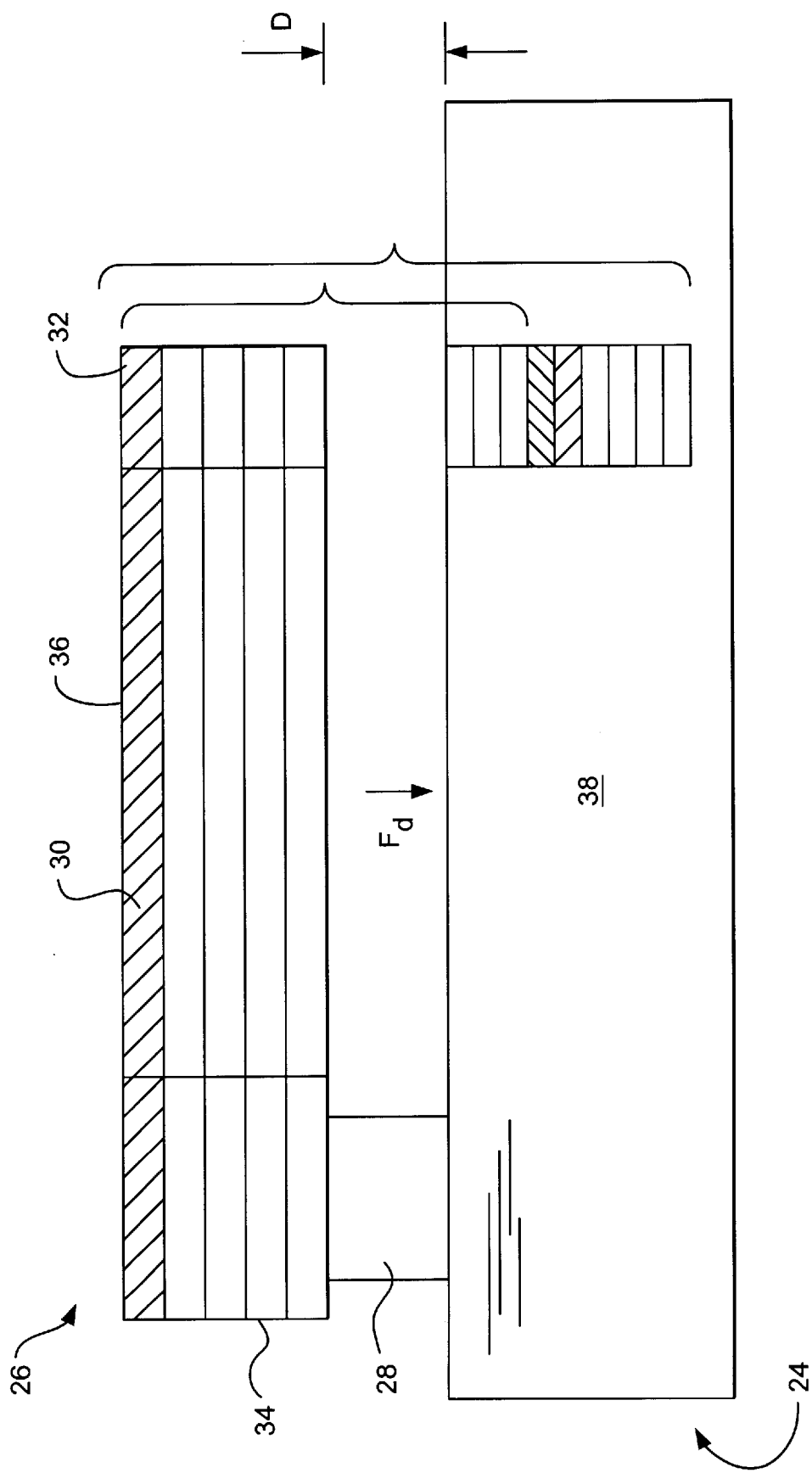
FIG. 5 is a sectional view of a VCSEL laser that can be used with the assembly of FIG. 1.

As illustrated in FIG. 5, cantilever apparatus 24 has a cantilever structure 26 consisting of a base 28, an arm 30 and an active head 32. The bulk of cantilever structure 26 may consist of a plurality of reflective layers 34 which form a distributed Bragg reflector (DBR). Layers can be formed of different materials including but not limited to AlGaAs. Different compositional ratios are used for individual layers 34, e.g., $Al_{0.09} Ga_{0.91} As/Al_{0.58} Ga_{0.42} As$. The topmost layer is heavily doped to ensure good contact with an electrical tuning contact 36 deposited on top of cantilever structure 26.

The actual number of layers 34 may vary from 1 to 20 and more, depending on the desired reflectivity of the DBR. Furthermore, any suitable reflecting material other than AlGaAs may be used to produce layers 34. Active head 32 is made of layers 34. However, arm 30 and base 28 do not need to be made of layers 34.

Base 28 can have a variety of different geometric configurations and large enough to maintain dimensional stability of cantilever structure 26. The width of arm 30 ranges typically from 2 to 8 mu m while its length is 25 to 100 mu m or more. The stiffness of arm 30 increases as its length decreases. Consequently, shorter cantilevers require greater forces to achieve bending but shorter cantilevers also resonate at a higher frequency. The preferred diameter of active head 32 falls between 5 and 40 mu m. Other dimensions are suitable.

Figure 6:
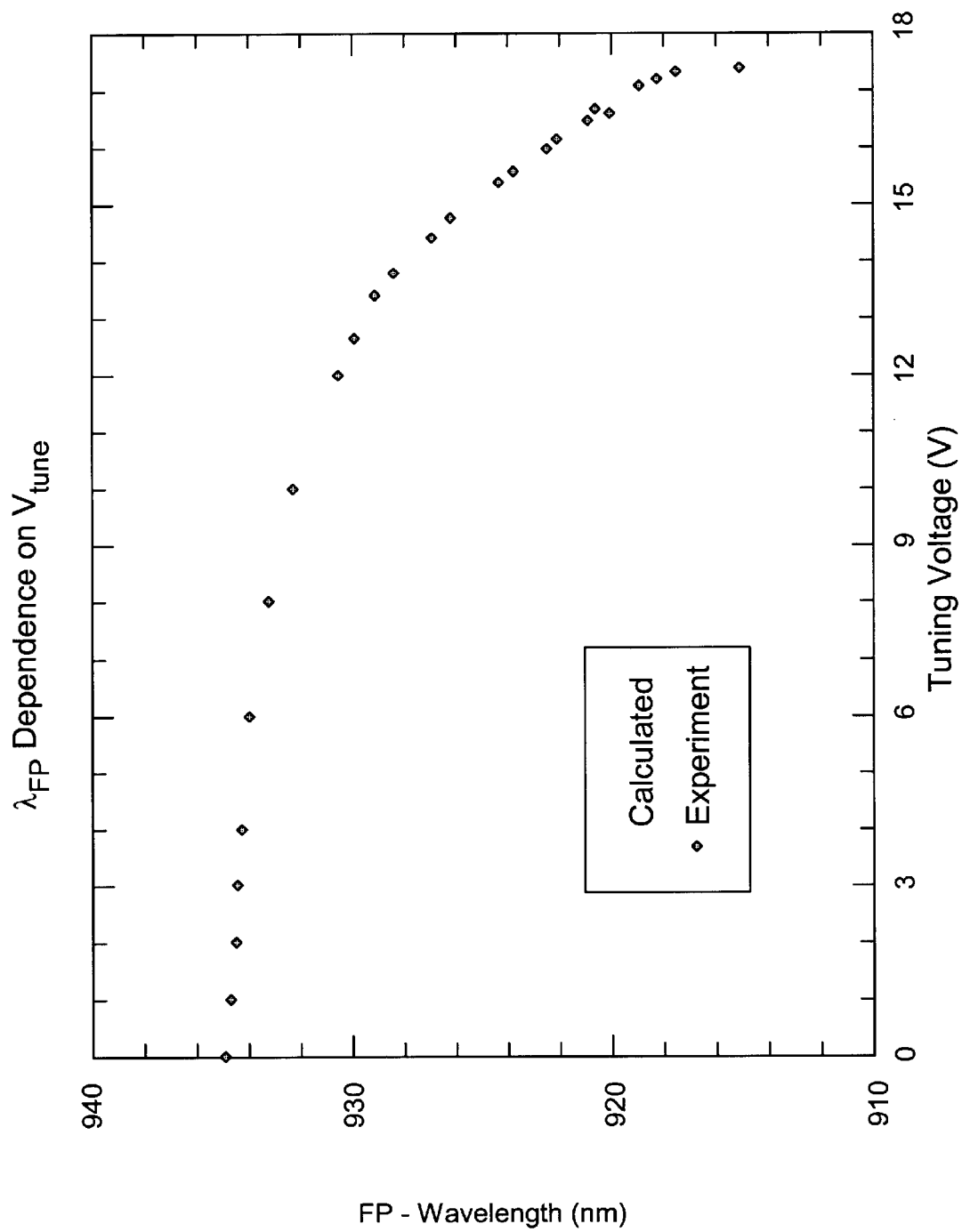
FIG. 6 is a graph illustrating a voltage wavelength relationship of the device of FIG. 5.

Electrical tuning contact 36 resides on all or only a portion of a top of cantilever structure 26. Tuning contact 36 is sufficiently large to allow application of a first tuning voltage $V_{t1}$. Base 28 is coupled to a single support post 37 and mounted on a substrate 38 across which a voltage can be sustained. Substrate 38 can include a second DBR 39. The relationship between voltage and wavelength is shown in FIG. 6. FIG. 6 illustrates a one-to-one relationship between voltage and wavelength. In certain embodiments, relationship is a linear relationship.

Figure 7:
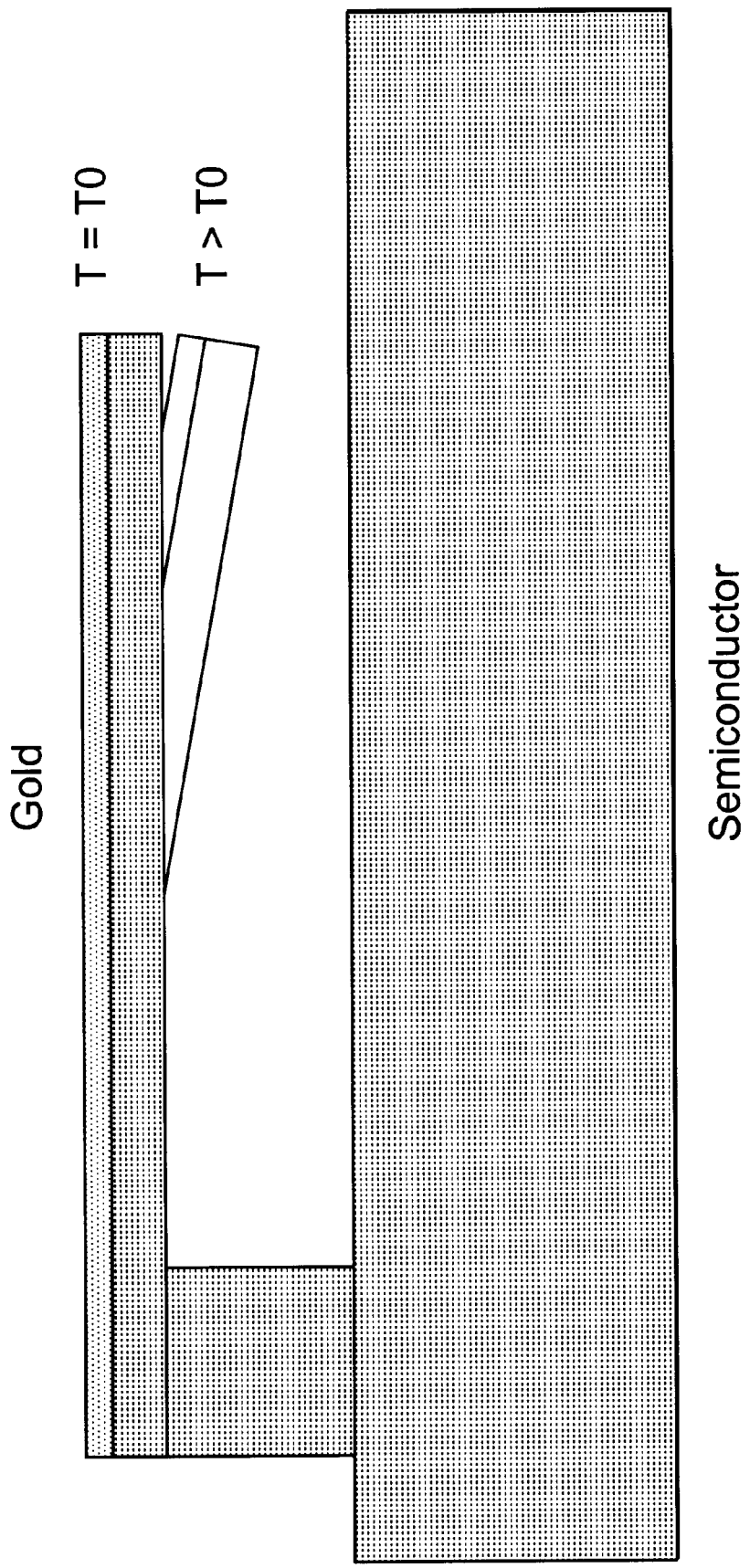
FIG. 7 illustrates movement of the cantilever structure of the VCSEL laser of FIG. 5 in response to a change in wavelength.

Substrate 38 can be made of the same material as layers 34. A voltage difference between layers 34 and substrate 38 causes a deflection of arm 30 towards substrate 38 as shown in FIG. 7. If layers 34 and substrate 38 are oppositely doped, then a reverse bias voltage can be established between them. Substrate 38 is sufficiently thick to provide mechanical stability to entire cantilever apparatus 24. Inside substrate 38 and directly under active head 32 are one or more sets of reflective layers with each set forming a second DBR. A more complete description of cantilever apparatus 38 is disclosed in U.S. Pat. No. 5,629,951, incorporated herein by reference.

Figure 8:
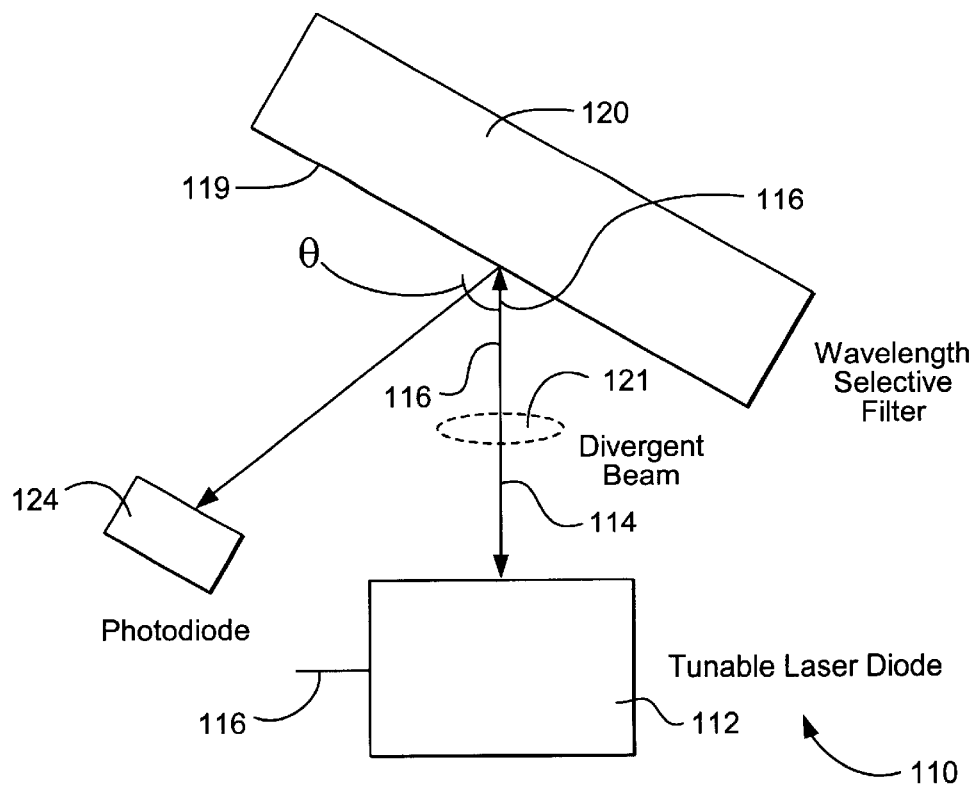
FIG. 8 is a schematic diagram of an embodiment of a monitoring and control assembly, used with the assembly of FIG. 1, with a wavelength selective filter positioned at an angle relative to an output face of a laser.

Referring now to FIG. 8, system 110 can also include is one or more photodetectors 124. Photodetector 124 can be an avalanche photodiode, a PIN photodiode, a metal-semiconductor-metal detector, and the like. Preferably, photodetector 124 is a PIN photodiode. Photodetector 124 converts optical energy into an electric current. Changes in electric current are used for monitoring and control of laser 112. Two or more photodetectors may be employed. In one embodiment, an array of photodetectors 124 is utilized. More than one photodiode 124 can be used greater discrimination in monitoring and control of laser 112, as more fully described hereafter.

Figure 9:
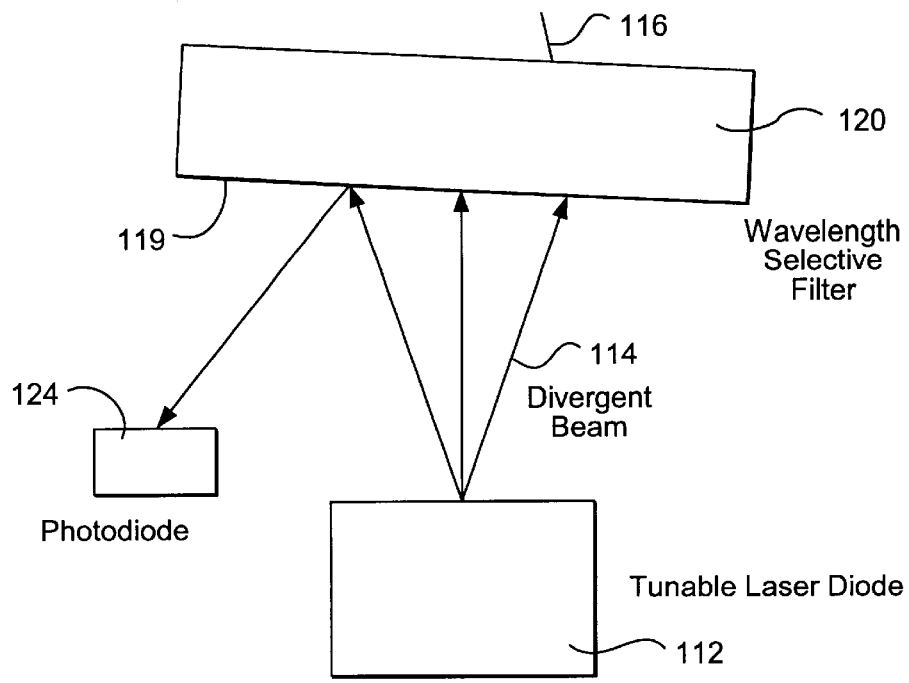
FIG. 9 is a schematic diagram of the assembly of FIG. 1 illustrating a change of the angle of the wavelength selective filter relative to the output face of the laser.

Positioned along optical axis 116 is a wavelength selective filter 120. Suitable wavelength selective filters 120 include but are not limited to a Bragg grading, multilayer-thin-film filter, solid Fabry-Perot etalon or an air gap etalon. Preferably wavelength selective filter 120 is a Fabry-Perot etalon or a multilayer-thin-film filter. Wavelength selective filter 120 can be tilted at an angle θ relative to optical axis 116 to provide an angular dependence of a wavelength reflection of wavelength selective filter 120 and direct the reflected output beam 114 towards photodetector 124. FIG. 9 illustrates a change in angle θ. Wavelength selective filter 120 is distanced from laser 112 and tilted at the angle θ relative to optical axis 116 in order to provide an angular dependence of wavelength reflection from wavelength selective filter 120. Wavelength selective filter 120 directs the reflected output beam 114 in a direction towards photodetector 124.

Wavelength selective filter 120 splits incident output beam 114 into a transmitted portion and a reflected portion. The ratio of the transmitted and reflected portions is a function of wavelength of output beam 114 and the angle θ that is defined by an incident face 119 of wavelength selective filter 120 relative to the incident beam.

Received power by photodetector 124 is a function of wavelength. When the wavelength of output beam 114 changes, there is change in received power by photodetector 124. When the total output power of output beam 114 is a constant, any change in received power at photodetector 124 is used as an indication that there has been a change in the wavelength of laser 112.

When wavelength selective filter 120 reflects a portion of output beam 114 to photodetector 124, the result is a compact assembly that can be an integral unit with monolithic integration of laser 112 with photodetector 124 on the same chip.

The divergence of laser 112 can be controlled by a lens 121 which can be an aspherical lens, a cylindrical lens, a spherical lens, a graded index lens of plastic or glass, and the like. A larger spot size gives wavelength selective filter 120 a shape closer to desired and provides better power transfer to photodetector 124.

For dense WDM applications, where precise wavelengths are required, a differential detection scheme is utilized to further enhance accuracy. A differential detection scheme compares the output from a pair of photodetectors 124. When there is an array, there is still a comparison between a pair of adjacent or non-adjacent photodetectors 124, one comparison made at a time. With a pair of photodetectors 124, a difference in response of the two photodetectors 124 is used to determine wavelength deviation from a pre-set wavelength.

Figure 10:
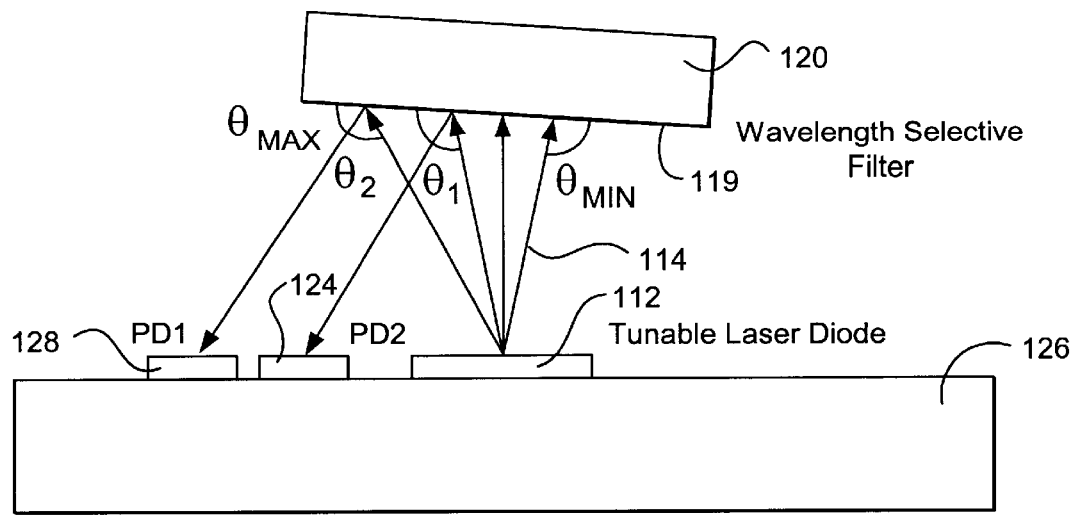
FIG. 10 is a schematic diagram of another embodiment of a monitoring and control assembly, used with the system of FIG. 1, with two photodetectors and a wavelength selective filter positioned at an angle relative to an output face of a laser.

Usually, output beam 114 is divergent. This divergence is used as an advantage for differential detection schemes. As illustrated in FIG. 10, when output beam 114 is divergent there is a range of incident angles $\theta_{min}$ to $\theta_{max}$ on face 119. The larger the divergence, the larger the difference between $\theta_{min}$ and $\theta_{max}$. When laser 112, photodetector 124 and wavelength selective filter 20 are in fixed positions relative to each other, and a beam receiving area of photodetector 124 is small, photodetector 124 only receives the portion of reflected output beam 114 with a particular incident angle $\theta_1$.

In FIG. 10 a second photodetector 128 is included and positioned adjacent to photodetector 124. In this embodiment, two different parts of output beam 114 are incident on photodetectors 124 and 128. A change in wavelength from laser 112 is converted to a difference in transmission detected by photodetectors 124 and 128.

Figure 11:
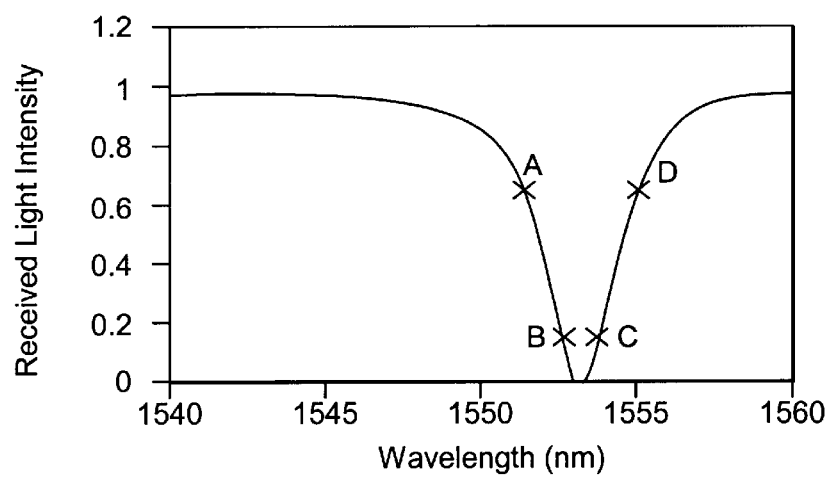
FIG. 11 is a graph illustrating light reflected from the wavelength selective filter and received by the photodetector of FIG. 8 when the wavelength of the light output from the laser changes.

FIG. 11 illustrates in one example of light reflected off wavelength selective element 120 that is received by photodiode 124 when the wavelength of the light output from laser 112 changes. The sharp changes at the 1552 nm region may be utilized for wavelength change detection between points A-B and C-D shown in FIG. 11.

Referring again to FIG. 10, second photodetector 128 is distanced from first photodetector 128 and receives a different portion of the reflected output beam 114 with a different incident angle $\theta_2$. Because of the difference of the incidence angles, the optical path lengths are different for the two portions of output beam 114 received by the respective photodetectors 124 and 128. Therefore, the relationship between the received power at each photodetector 124 and 128 verses wavelength is shifted.

Figure 12:
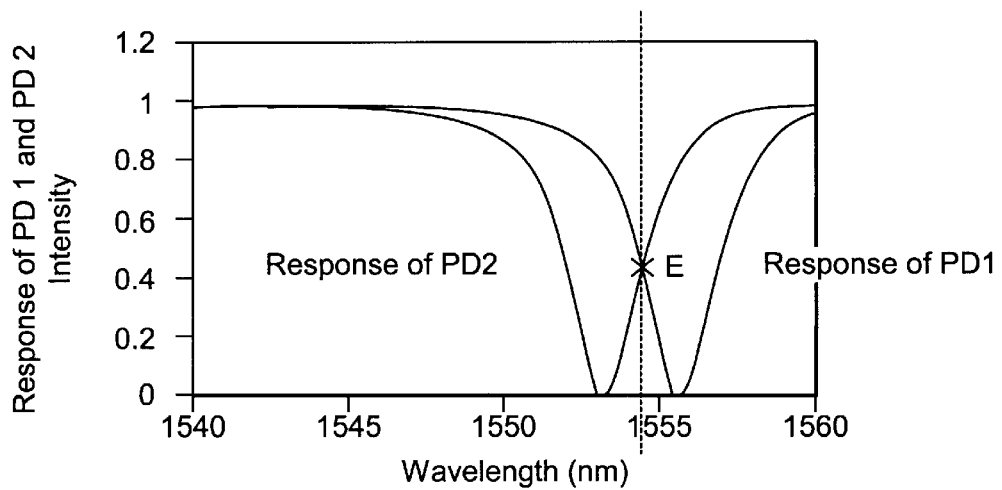
FIG. 12 is a graph illustrating the response expressed as intensity as a function of wavelength of the two photodetectors of FIG. 10.

This shift is determined by the distance between photodetectors 124 and 128, their distance from face 119 of wavelength selective element 120, and the distance between wavelength selective element 120 to laser 112, as illustrated in FIG. 12. At point E, at which the responses from photodetectors 124 and 128 are equal, this is used in setting up the target wavelengths for wavelength locking purposes. Any deviation from the wavelengths results in a difference in response intensity at the two photodetectors. This difference can be used in a feedback control loop to change the wavelength of laser 112 back to the target wavelength, as described in greater detail hereafter. In WDM applications each communication channel is set at a pre-determined wavelength. The wavelength of each transmitter output should be stabilized to much better than the channel spacing. For example, for 50 GHz channel spacing, the wavelengths should be stabilized to at least 5 GHz.

Figure 13:
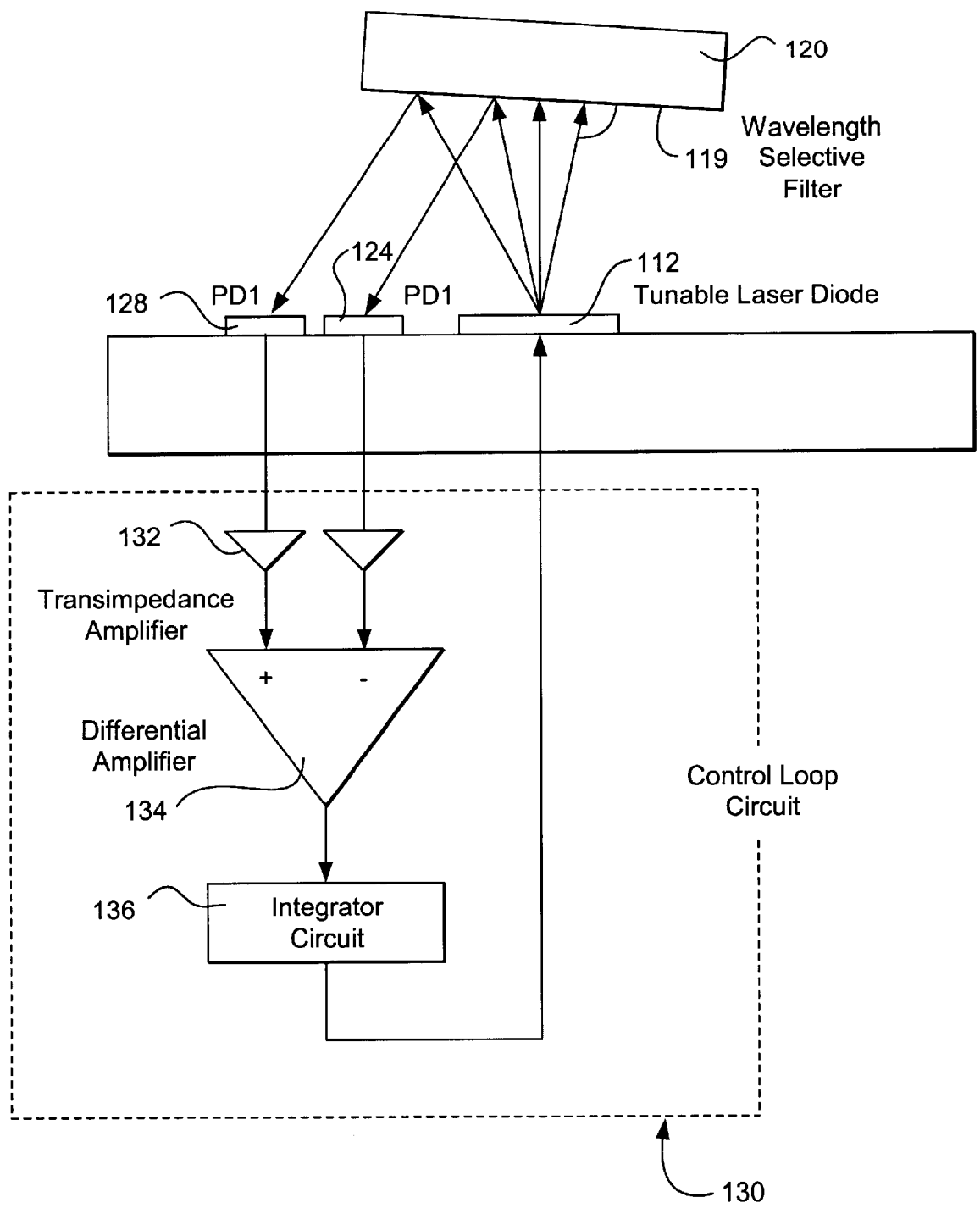
FIG. 13 is a schematic diagram of a control loop circuit in combination with the assembly of FIG. 10.

Referring now to FIG. 13, one embodiment of a control loop circuit, generally denoted as 130, is coupled to photodetectors 124 and 128 and laser 112. Control loop circuit 130 includes a transimpedance amplifier 132, a differential amplifier 134 and an integrator circuit 136. Control loop 130 provides a feedback of a difference signal generated by photodetectors 124 and 128 in response to a change in wavelength of laser 112. Control loop circuit 130 provides wavelength stabilization of the laser in response to a change in wavelength of laser 112.

Photodetectors 124 and 128 convert optical energy to a current for a feedback loop for controlling laser 112. The wavelength of laser 112 determines how much of output beam 114 is reflected by wavelength selective filter 120. The signal received by each photodetector 124 and 128 is dependent on the wavelength emitted by laser 112. Because of the angular dependence of wavelength selective filter 120 a wavelength variation from laser 112 is converted to a transmission and reflection change. The wavelength change is detected as a power change. In one embodiment, the output signals from photodetectors 124 and 128 are used to generate a difference signal in differential amplifier 134 which is fed to integrator circuit 136 for controlling the output wavelength of laser 112. By arranging that the reflection detected by photodetectors 124 and 128 is the same at a selected wavelength, the difference signal is set to be zero at the predetermined wavelength (the locked wavelength). The locked wavelength can be set with equivalent stability to different values by using unequal gains for photodetectors 124 and 128. If the wavelength of laser 112 changes the differential signal generated by photodetectors 124 and 128, the error signal, is wavelength dependent and is used to monitor the wavelength of laser 112.

Monitoring and control of laser 112 is wavelength tunable by changing the angle of inclination $\theta$ of wavelength selective filter 120. Wavelength selective filter 120 can be mounted on an adjustable support with four degrees of freedom. Control loop circuit 130 is dependent on a number of different factors. These factors include, the wavelength selective filter 120 tilt angles in the x and y axis, the wavelength selective filter 120 index change with temperature, the photodetectors 124 and 128 x and y axis offsets and the divergent angle of the incident beam from laser 112.

In various embodiments, laser 112 can be coupled with any number of photodetectors including an array, and form a monolithically integrated chip and/or an integral assembly. An array has a number of advantages including but not limited to, enhancing flexibility of geometry of assembly 110, providing photodetector redundancy to enhance reliability and lifetime and provides a larger range of wavelengths, for example to cover the entire wavelength range of 800 nm to 1650 nm. In one embodiment, assembly 110 can be used as a wavelength tuning and locking element.

Figure 14:
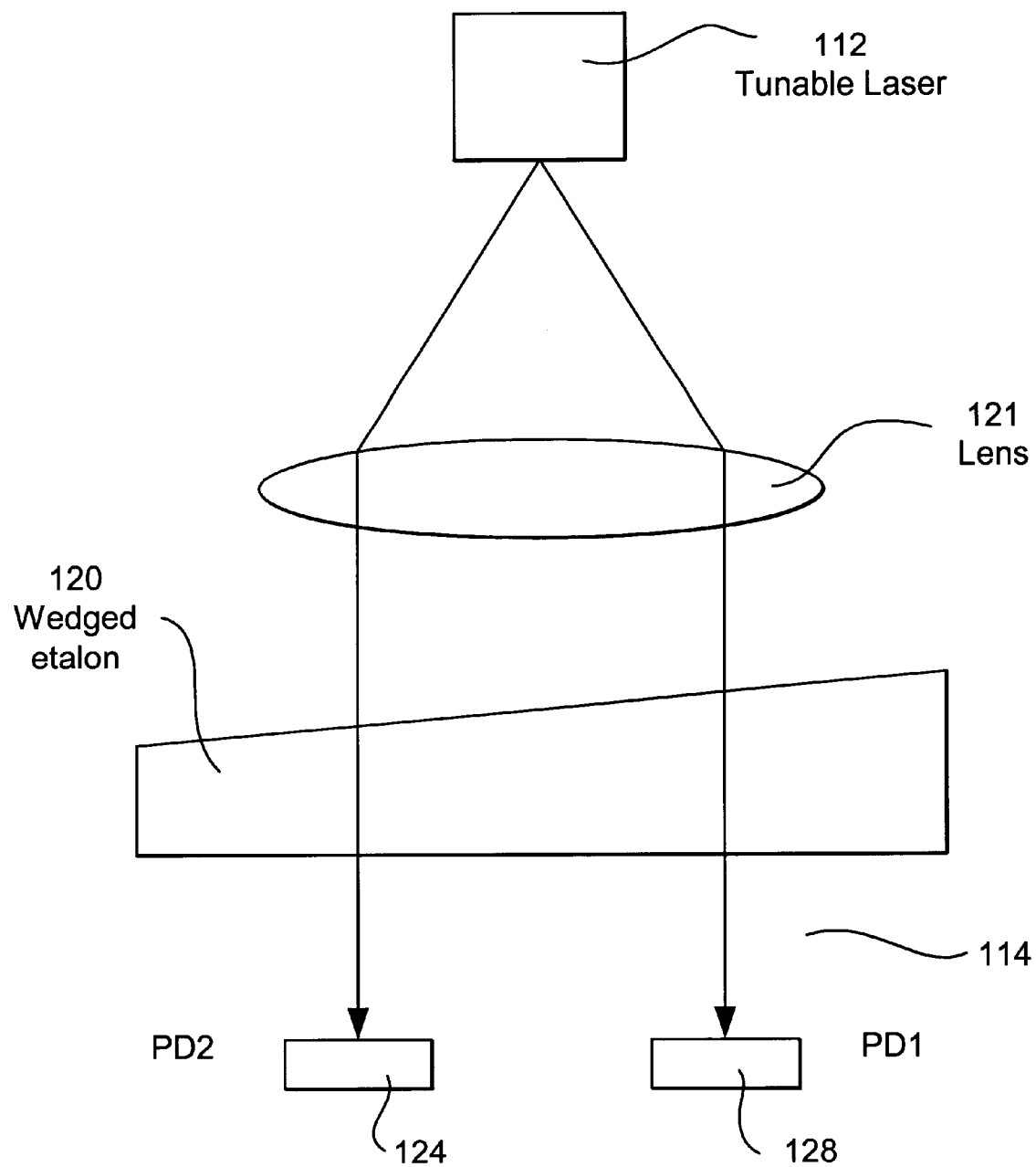
FIG. 14 is a schematic diagram of an embodiment of a monitoring and control assembly, used with the assembly of FIG. 1, with a wedged wavelength selective filter operating in a transmissive mode.

In another embodiment illustrated in FIG. 14, wavelength selective filter 120 has a wedged shape with a thickness that varies monotonically in a lateral direction. Output beam 114 is collimated by lens 121. Each photodiode 124 and 128 respectively, receives light that corresponds to different positions of wavelength selective filter 120 with a different thickness. With wedged shaped wavelength selective filter 120, each photodiode 124 and 128 has a distinct wavelength dependence. In one embodiment, the wedge angle of wavelength selective filter 120 is determined by a desired capture range. It is preferred that the capture range substantially match the deviation of emitted laser wavelengths from the targeted wavelengths.

Figure 15:
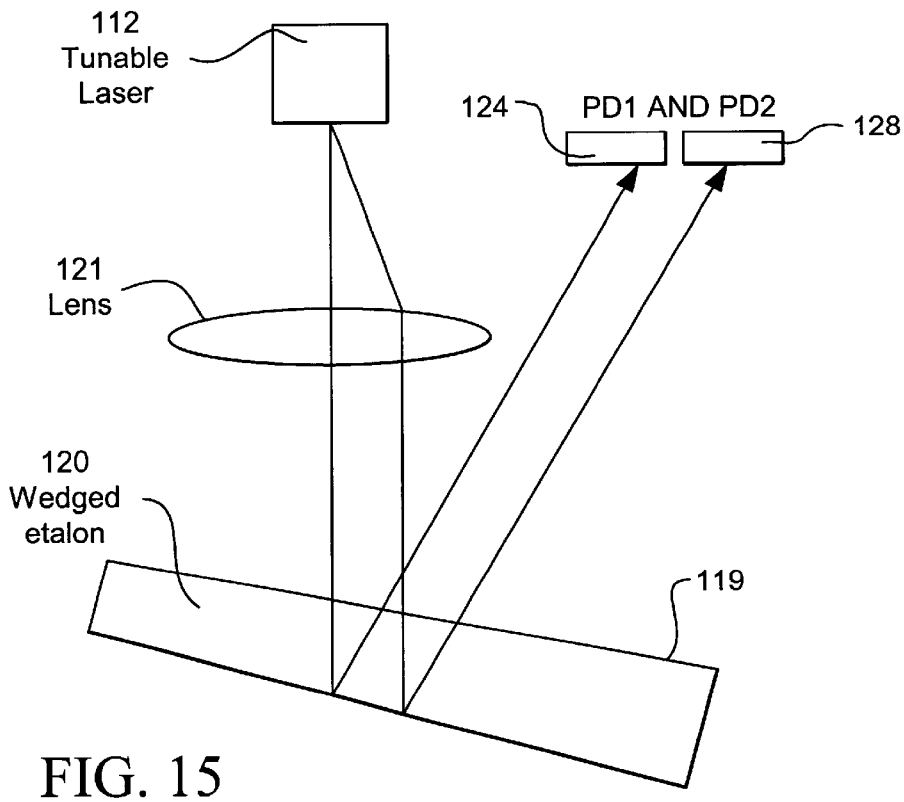
FIG. 15 is a schematic diagram of an embodiment of a monitoring and control assembly, used with the assembly of FIG. 1, with a wedged wavelength selective filter operating in a reflective mode.
Figure 16:
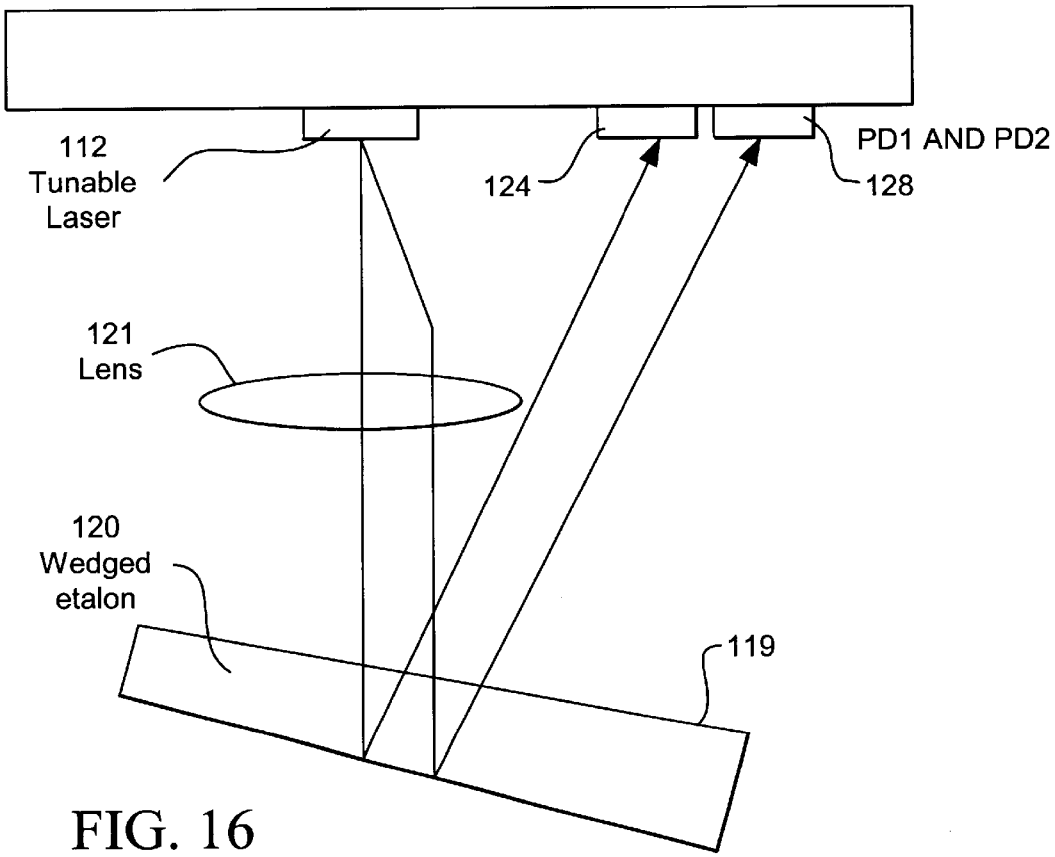
FIG. 16 is a schematic diagram of the assembly of FIG. 15 with the laser and photodiodes positioned on a common substrate.

Wedged selective wavelength filter 120 can be used in the reflective mode as illustrated in FIGS. 15 and 16.

Assembly 110 can be programmable. In WDM applications, a set of discrete wavelengths with equal spacing in frequency is defined as the ITU grid. It is desirable to have a programmable WDM source that can be set to any wavelengths on the ITU grid and stabilized at that wavelength per demand.

Figure 17:
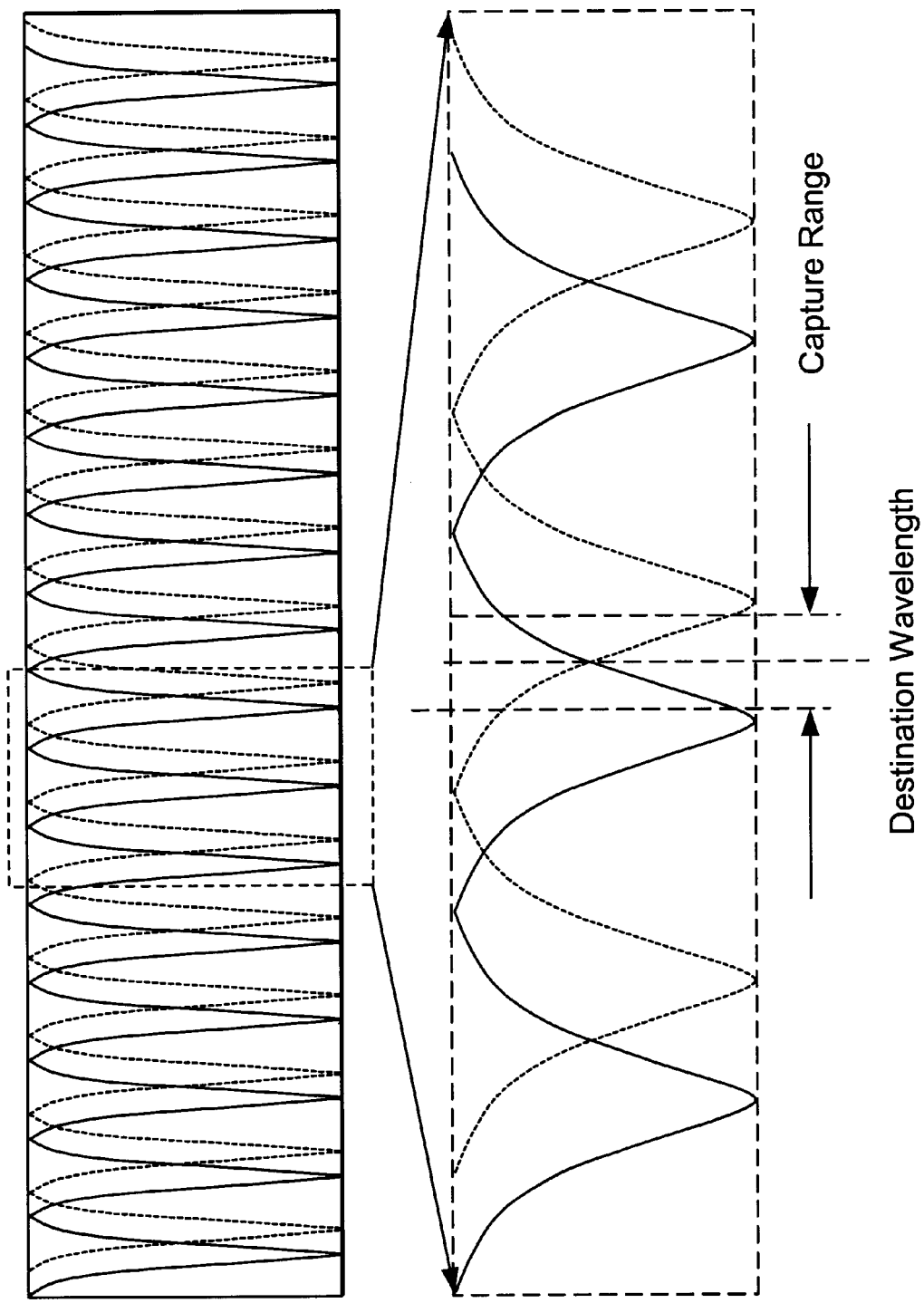
FIG. 17 is a graph illustrating an embodiment of the assembly of FIG. 1 where the free spectra range of the wavelength selective filter coincides with the ITU grid spacing.

In one embodiment, illustrated in FIG. 17, wavelength selective filter 120 can be an etalon with a free spectra range that coincides with the ITU grid spacing. During assembly, the response of photodiodes 124 and 128 is set up such that the locking wavelength coincides with the precise ITU grid wavelength. Assembly 110 can be programmable and tunable with voltage tuning, temperature tuning and current tuning.

Figure 18:
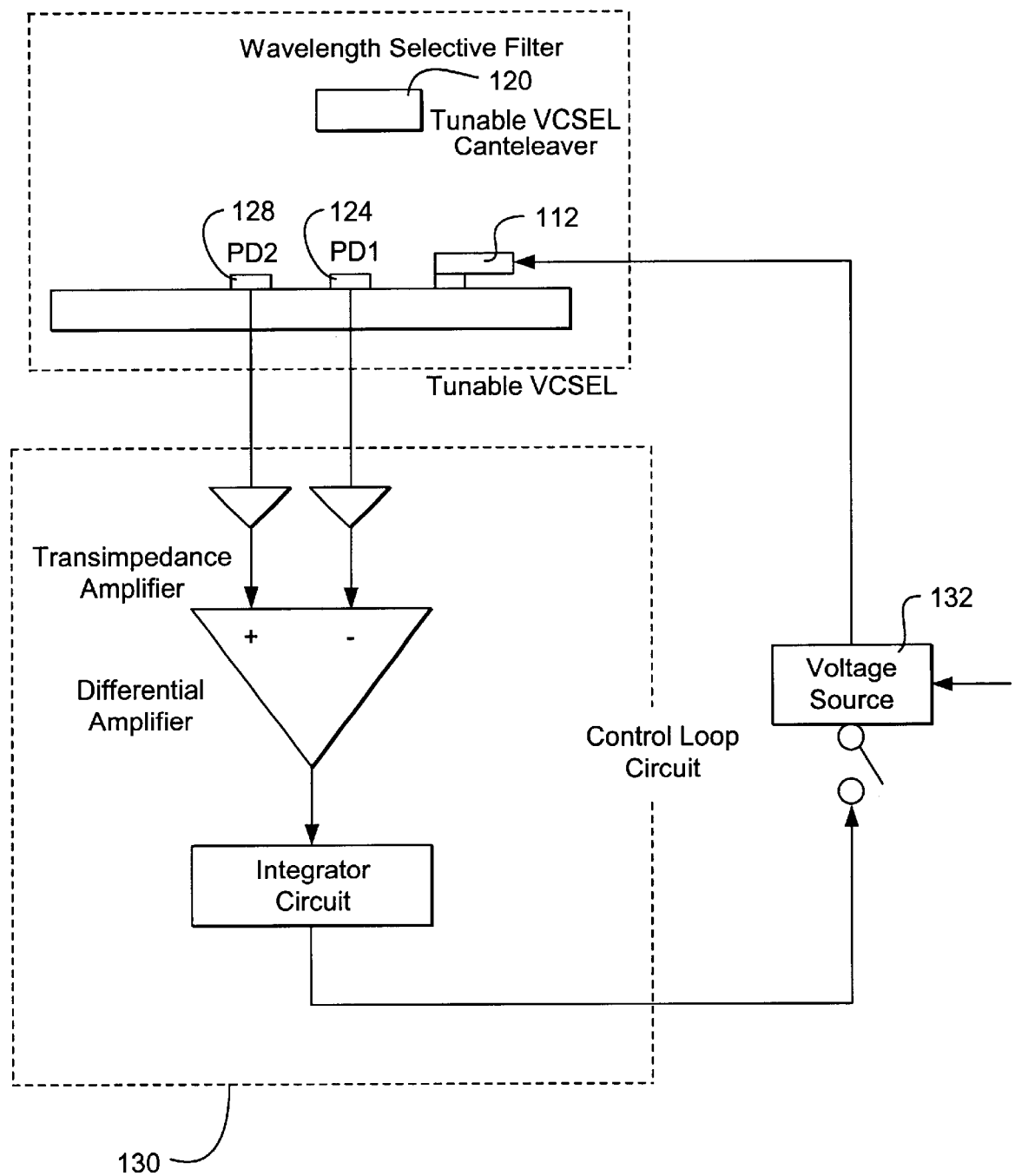
FIG. 18 is a schematic diagram of an embodiment of a monitoring and control assembly, used with the assembly of FIG. 1, that includes a control loop circuit and is programmable.

FIG. 18 illustrates a voltage tuning embodiment with a voltage source 132. The wavelength vs. tuning voltage characteristics of laser 12 are tabulated and saved. In the embodiment of FIG. 18, programmability can be achieved by, (i) disabling control loop circuit 130, (ii) stepping the voltage to the value that corresponds to the destination wavelength which may be saved in a look-up table in a memory chip and (iii) turning on control loop circuit 130.

Figure 20:
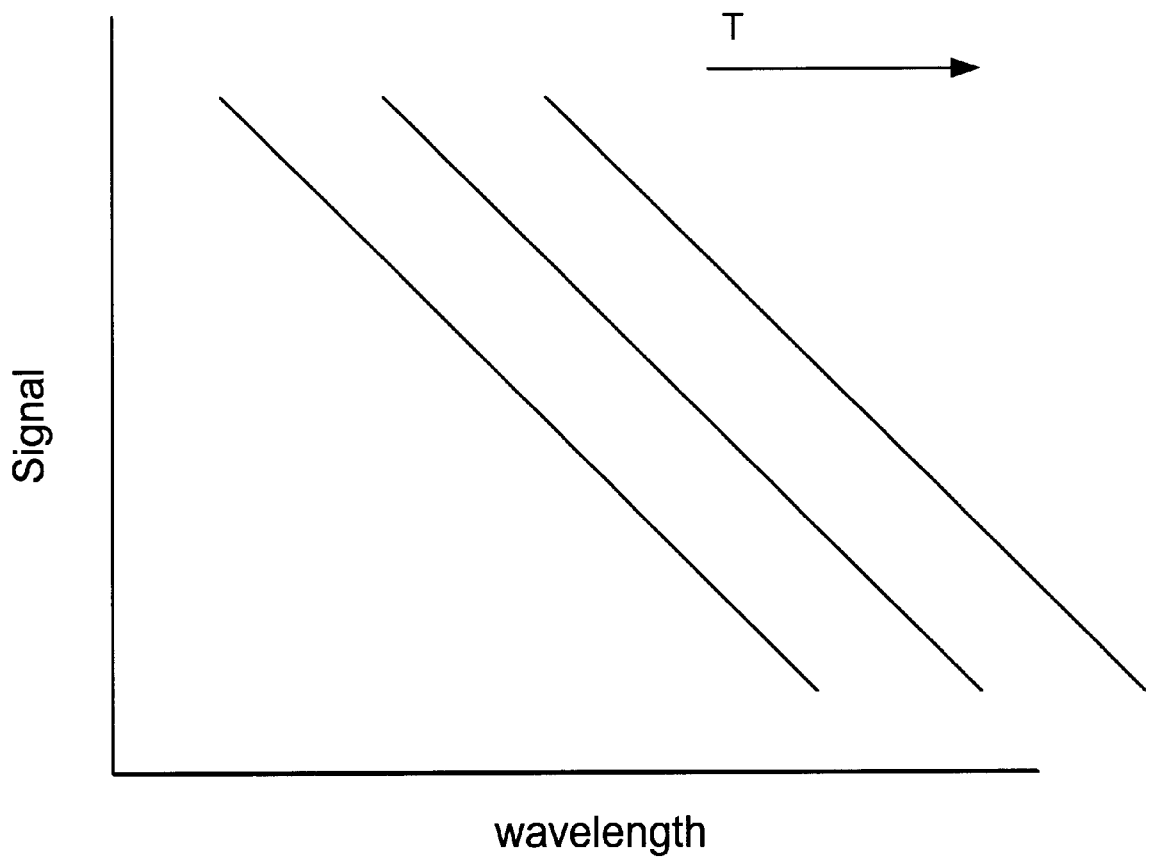
FIG. 20 is a graph illustrating the change in wavelength meter response with temperature.
Figure 21:
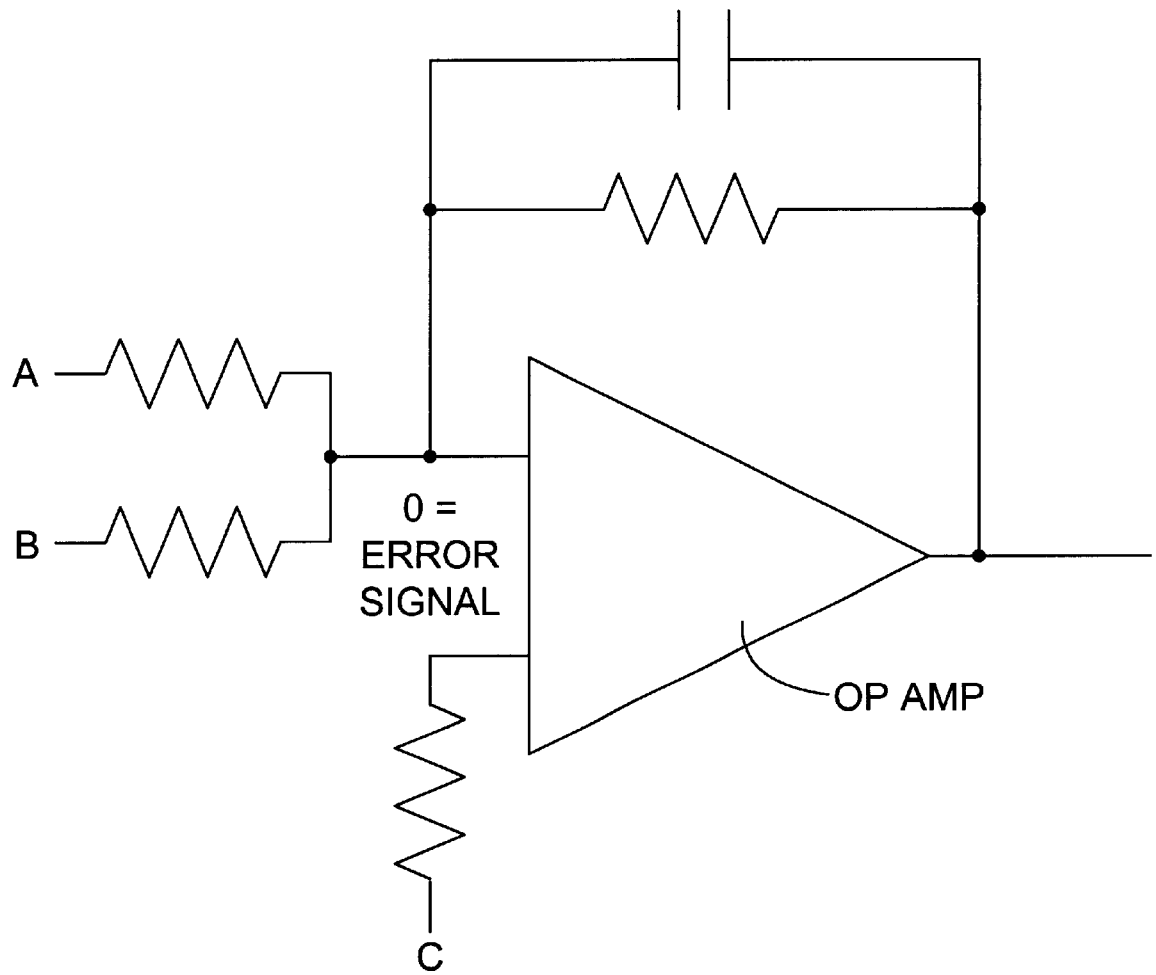
FIG. 21 is a schematic diagram of the generation of an error signal from the FIG. 1 assembly.
Figure 22:
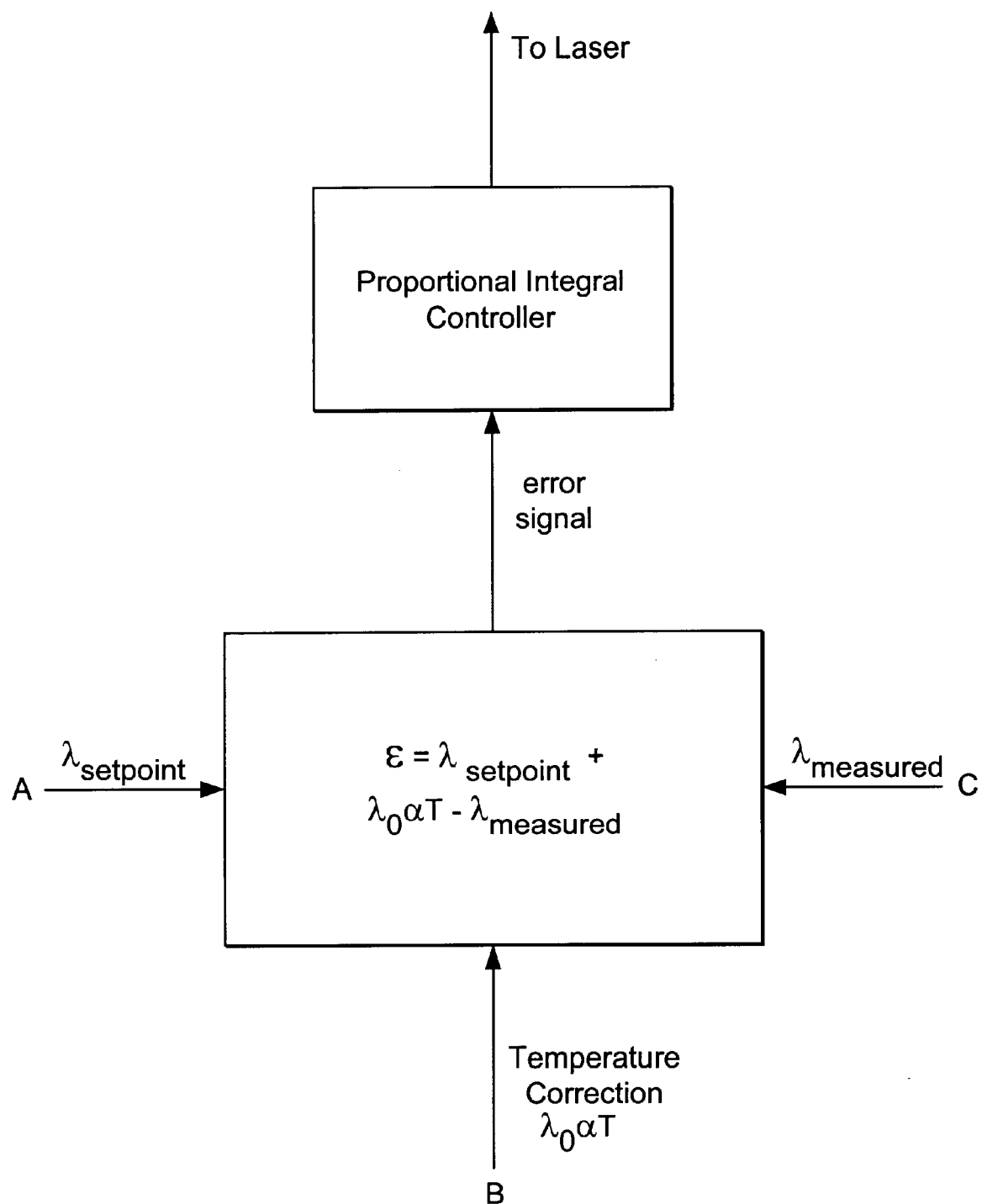
FIG. 22 is a schematic diagram of an embodiment of the FIG. 1 assembly.

Wavelength selective filter 120 is designed so that the desired wavelength is positioned as shown in FIGS. 19(*a*) and 19(*b*) with respect to the wavelength selective filter 120 transmission. As illustrated in FIG. 20, the output of the wavelength selective filter 120 is sensitive to temperature. As the temperature changes, the Favbry-Perot wavelength of the etalon shifts which causes a shift in the signal as illustrated in FIG. 20. This shift can be compensated electronically as shown in FIG. 21. The system illustrated in FIG. 21 can be implemented by a circuit of the type illustrated in FIG. 22.

Systems 10 and 110 can be used with the multiplexers and de-multiplexers disclosed in U.S. Patent Applications, Attorney Docket Nos. 21123-705 and 21123-706, filed on the same date as this application and incorporated herein by reference. Additionally, systems 10 and 110 can be used with the monitoring and control assemblies disclosed in U.S. Patent Application, Attorney Docket No. 21123-701, filed on the same date as this application, and incorporated herein by reference.

Systems 10 and 110 can be utilized for the wavelengths and metrowave fibers (MWF) disclosed in U.S. Pat. No. 5,905,838, incorporated herein by reference. An illustrative specification table for a suitable metrowave fiber is presented:

| MWF Specification Table |
| --- |
| Attenuation at 1550 nm |
| <=0.25 dB/km |
| Attenuation at 1310 nm |
| <=0.50 dB/km |
| Effective area at 1550 nm |
| >=42 microns |
| Core eccentricity |
| Less than or equal to 0.8 microns |
| Cladding diameter |
| 125 +− 2.0 microns |
| Cut-off wavelength |
| <1250 nm |
| Zero-dispersion wavelength |
| 1350 nm–1450 nm |
| Dispersion at 1310 nm |
| −3.0 to −8 ps/nm-km |
| Dispersion at 1550 nm |
| +3.0 to +8 ps/nm-km |
| Dispersion slope at 1550 nm |
| 0.01–0.05 ps/nm sup 2 -km |
| Macrobendingloss at 1310 nm |
| <0.5 dB (1 turn, 32 mm) |
| Macrobending loss at 1550 nm |
| <0.05 dB (100 turns, 75 mm) |
| Coating diameter 245 +− 10 microns |
| Proof test 100 kpsi |
| Reel lengths 2.2, 4.4, 6.4, 8.8, 10.8, 12.6, 19.2 km |

Laser 12 can include a sealing cap, as disclosed in U.S. Patent Application, Attorney Docket No. 21123-703, filed on the same date as this application, and incorporated herein by reference.

Figure 23:
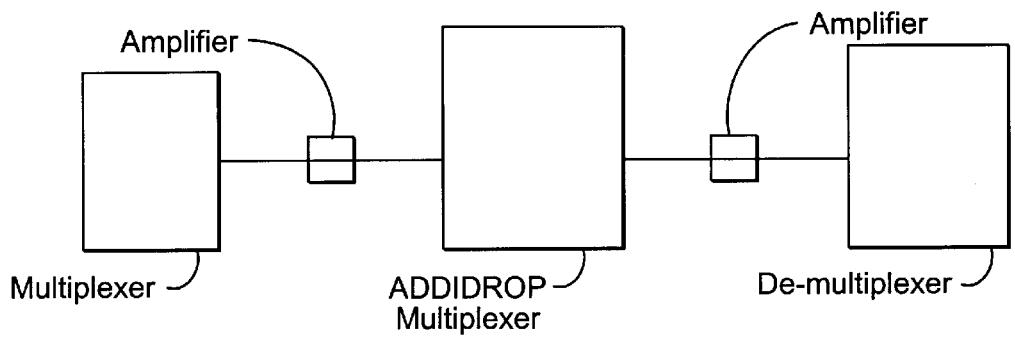
FIG. 23 is a schematic diagram of an embodiment of the present invention illustrating a DWDM system.

In other embodiments of the present invention, DWDM systems, sub-systems and devices are provided. In these embodiments, the present invention is applicable to coarse or wide wavelength-division multiplexing. Sub-systems of the present invention include but are not limited to multiplexers, de-multiplexers, add/drop multiplexers, gain flatteners, taps and filters. In one embodiment illustrated in FIG. 23, a DWDM system 210 includes a multiplexer, a de-multiplexer and a DWDM sub-system that is coupled to the multiplexer and the de-multiplexer. Also included are one or more amplifiers. The DWDM systems, sub-systems and devices of the present invention provide improved flexibility of wavelength adding, combining, dropping, separating and leveling. The DWDM devices, sub-systems and systems of the present invention permit different system and sub-system, (i) configurations, (ii) levels of signal filtration and (ii) combinations of signals that are multiplexed and de-multiplexed.

In one embodiment of the present invention, the DWDM systems, sub-systems and devices have low cross talk that is better than 20 dB. It will be appreciated that the present invention is not limited to cross talk that is better than 20 dB.

Figure 24:
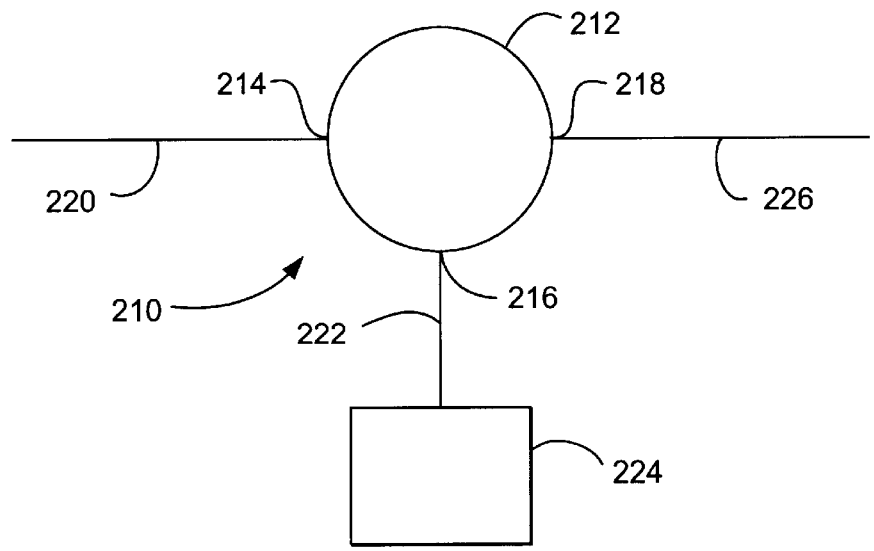
FIG. 24 is a schematic diagram of multiplexer or de-multiplexer of the present invention that includes a three port optical circulator and a filter that is reflective and transmissive coupled to the optical circulator.

Referring now to FIG. 24, one embodiment of the invention is a multiplexer 210 that includes an optical circulator 212 with at least first, second and third circulator ports 214, 216 and 218 respectively. Multiplexer 210 can includes any number of circulator ports. An optical fiber with a first optical transmission path 220 is coupled to first circulator port 214. The optical fiber carries a wavelength division multiplexed optical signal, including signals $\lambda_1$–$\lambda_n$, and at least one signal $\lambda_1$ to be dropped by multiplexer 210. The signal $\lambda_1$ can be any of the signals $\lambda_1$–$\lambda_n$. A second optical transmission path 222 is in optical communication with second circulator port 216. A first filter 224 is coupled to second optical transmission path 222. Filter 224 is transmissive in one or more signals and reflective of all other signals, has a high degree of reflectivity, works well across the entire DWDM spectrum and has minimal gain slope. Filter 224 passes a portion of the $\lambda_1$ signal, and reflects a first residual $\lambda_1$ signal and signals $\lambda_2$–$\lambda_n$ to optical circulator 212. A third optical transmission path 226 is in optical communication with third circulator port 218 and transmits the signals $\lambda_2$–$\lambda_n$ received from the optical circulator. Filter 224 reduces the cross-talk of multiplexer 210. In one embodiment, one detector and at least two filters 224 bring down the cross talk to 50 dB, and more preferably 45 dB.

Figure 25:
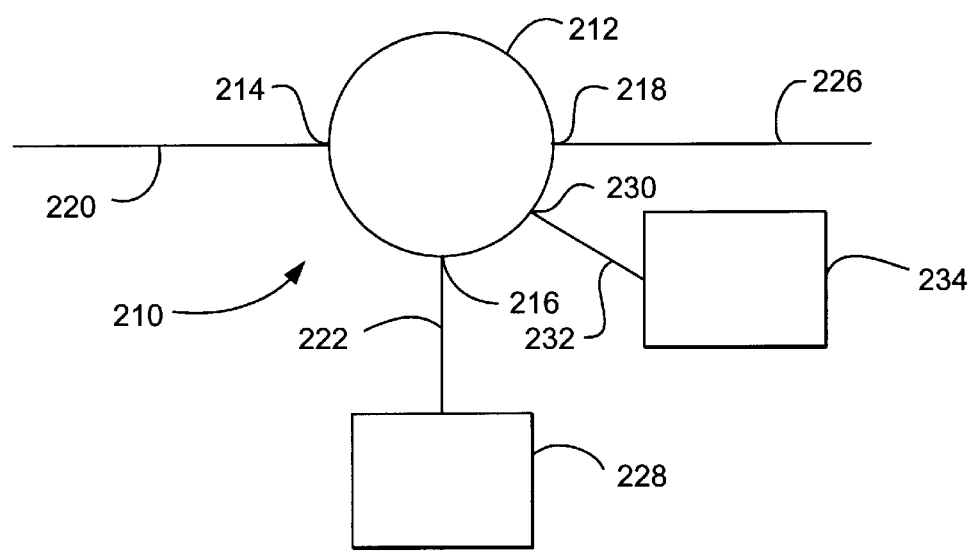
FIG. 25 is a schematic diagram of multiplexer or de-multiplexer that includes a four port optical circulator and a detector/filter that detects and passes a portion of a signal, reflects a residual portion of the passed signal along with all other signals, as well as a second optoelectronic device coupled to the optical circulator.

Another embodiment of a multiplexer 210 of the present invention is illustrated in FIG. 25. Optical circulator has four optical circulator ports 214, 216, 218 and 230. A detector/filter 228 is coupled to second optical transmission path 222. Detector/filter combines the two functions of detection and filtering and is typically an integrated device. Detector/filter 228 detects the $\lambda_1$ signal, passing a portion of the $\lambda_1$ signal, and reflects a first residual $\lambda_1$ signal and signals $\lambda_2-\lambda_n$ to optical circulator 212. Preferably, a majority of the signal $\lambda_1$ is passed. Preferably, at least 95% of the signal $\lambda_1$ is passed, and more preferably 99%. Detector/filter 228 can be an integral or a non-integral detector and filter device. Fourth optical transmission path 232 is positioned between second and third optical transmission paths 222 and 226. An optoelectronic device 234 is coupled to fourth optical transmission path 232. In this embodiment, multiplexer 210 is an optical tap, add-drop multiplexer or gain/loss equalization device.

Optoelectronic device 234 can be a detector/filter, a filter or a laser 12. Suitable lasers and laser assemblies are disclosed in U.S. Patent Applications, Attorney Docket Nos. 21123-701, 21123-702, 21123-703, filed on the same date of this application and incorporated herein by reference. When optoelectronic device 234 is a detector/filter or a filter, multiplexer 212 is an optical drop or gain equalization device. When optoelectronic device 234 is a laser, multiplexer 212 is an add-drop multiplexer. Detector/filter 234 detects the first residual $\lambda_1$ signal, passes the first residual $\lambda_1$ signal and reflects a second residual $\lambda_1$ signal and the signals $\lambda_2-\lambda_n$ which are received at optical circulator 212. The second residual $\lambda_1$ signal has a few percent, preferably 5% or less, of the original first residual $\lambda_1$ signal, and more preferably only 0.1%. Filter 234 does not detect the signal $\lambda_1$. Filter 234 passes the first residual $\lambda_1$ signal and reflects the second residual $\lambda_1$ signal and the signals $\lambda_2-\lambda_n$ which are again received at optical circulator 212. Laser 12 reflects the first residual $\lambda_1$ signal and the signals $\lambda_2-\lambda_n$ and adds back the signal $\lambda_1$. Laser 12 preferably is a laser emitting an ITU grid wavelength with a front face with high reflectivity (up to 99%) to incident wavelengths other than the lasing wavelength. Instead of adding back the signal $\lambda_1$ laser 12 can add a new signal, the $\lambda_{n+1}$ signal.

Figure 26:
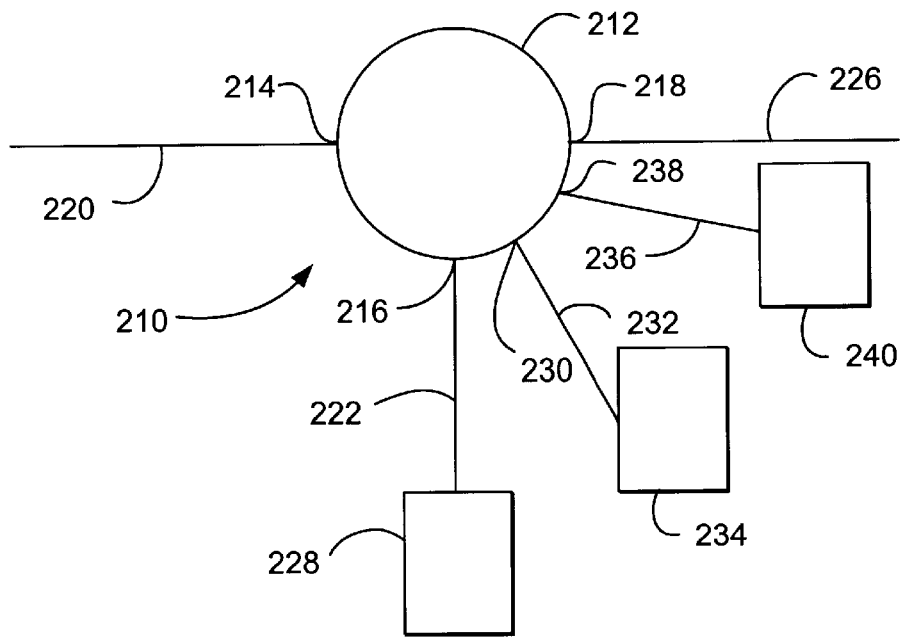
FIG. 26 is a schematic diagram of the multiplexer or de-multiplexer of FIG. 25 with an additional optical circulator port, optical transmission path and a third optoelectronic device.

Referring now to FIG. 26, multiplexer 210 can further include a fifth optical transmission path 236 in optical communication with a third optical circulator port 238. Fifth optical transmission path 236 is positioned between fourth and fifth optical transmission paths 232 and 226 respectively. A second optoelectronic device 240 is coupled to fifth optical transmission path 236. Second optoelectronic device 240 can be a detector/filter, filter or laser 240. In the embodiment of FIG. 26, detector/filter 228 is coupled to second optical transmission path 222. One of detector/filter 234, filter 234 or laser 234 is coupled to fourth optical transmission path 232.

In FIG. 26, when detector/filter 234 is coupled to fourth optical transmission path 232, detector/filter 240 detects the second residual $\lambda_1$ signal, passes the second residual $\lambda_1$ signal and reflects a third residual $\lambda_1$ signal and the signals $\lambda_2-\lambda_n$ which are received at optical circulator 212. Filter 240 passes the second residual $\lambda_1$ signal and reflects the third residual $\lambda_1$ signal and the signals $\lambda_2-\lambda_n$ which are again received at optical circulator 212. In this embodiment, multiplexer 212 is an optical drop, add-drop multiplexer or gain/loss equalization device. Laser 234 reflects the second residual $\lambda_1$ signal and the signals $\lambda_2-\lambda_n$, and either adds back the signal $\lambda_1$ or adds a new $\lambda_{n+1}$ signal. In this embodiment, multiplexer 212 is an add-drop multiplexer.

Further in FIG. 26, when laser 234 is coupled to fourth optical transmission path, detector/filter 240 detects the first residual $\lambda_1$ signal, passes the first residual $\lambda_1$ signal and reflects a second residual $\lambda_1$ signal, the signals $\lambda_2-\lambda_n$ and the signal $\lambda_{n+1}$. Filter 240 passes the first residual $\lambda_1$ signal and reflects a second residual $\lambda_1$ signal, the signals $\lambda_2-\lambda_n$ and the signal $\lambda_{n+1}$. Laser 234 reflects the first residual $\lambda_1$ signal, the signals $\lambda_2-\lambda_n$, the signal $\lambda_{n+1}$ and adds back the signal $\lambda_1$ or adds a new signal $\lambda_{n+2}$.

Figure 27:
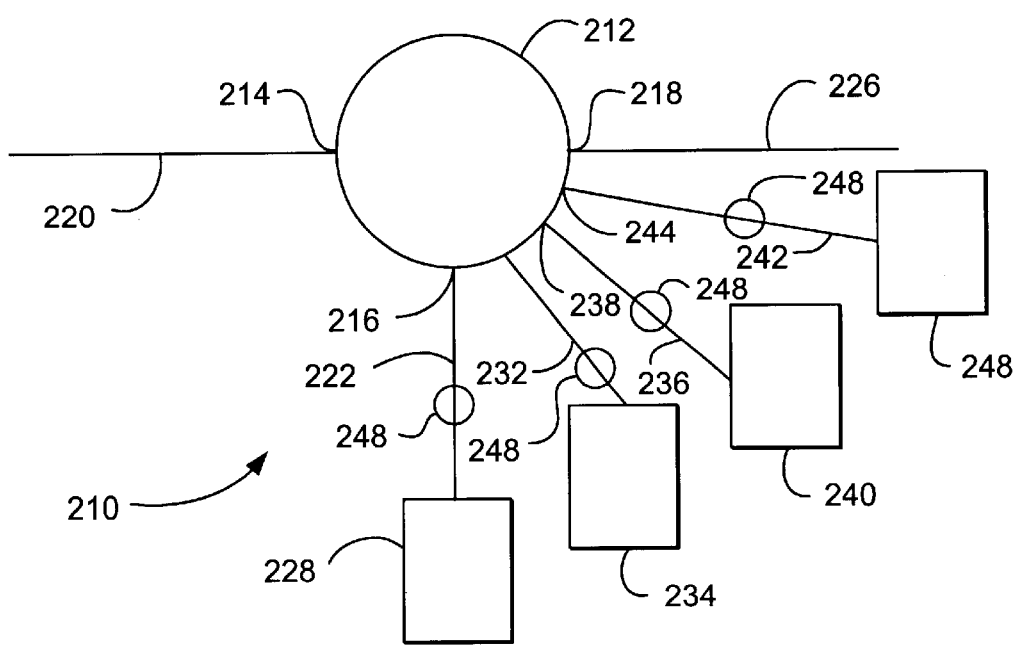
FIG. 27 is a schematic diagram of the multiplexer or de-multiplexer of FIG. 26 with an additional optical circulator port, optical transmission path and a fourth optoelectronic device.

As shown in FIG. 27, a sixth optical transmission path 242 is in optical communication with a sixth optical circulator port 244. Sixth optical transmission path 242 is positioned after between fifth and third optical transmission paths 236 and 226. An optoelectronic device 246 is coupled to sixth optical transmission path 242. Optoelectronic device 246 can be a detector/filter, filter or laser 12.

In FIG. 27, when detector/filter 234 or filter 234 is coupled to fourth optical transmission path 232, and detector/filter 240 or filter 240 is coupled to fifth optical transmission path 236, laser 246 reflects the third residual $\lambda_1$ signal, the signals $\lambda_2-\lambda_n$ and adds back the signal $\lambda_1$ or adds the new signal $\lambda_{n+1}$.

In each of FIGS. 2–5, a bidirectional optical amplifier 248 can be coupled to any of the second, third, fourth, fifth or sixth optical transmission paths 222, 232, 236 and 242 respectively, and positioned between the optoelectronic device and optical circulator 212. Bi-directional optical amplifier 248 has low noise, flat gain and is able to handle the entire DWDM signal range. Additionally, some or all of detector/filter, filter, bidirectional amplifier and laser 246 can be programmably or non-programmably tunable.

In the embodiment illustrated in FIG. 28, filter 224 is coupled to second optical transmission path 222. Filter 224 passes a majority of the signal $\lambda_1$ and reflects the first residual $\lambda_1$ signal and signals $\lambda_2-\lambda_n$ to optical circulator 212. An optoelectronic device 234 is coupled to fourth optical transmission path 230. Optoelectronic device 234 can be a filter, detector/filter, laser amplifier or attenuator.

When optoelectronic device 234 is a filter, multiplexer 210 is an optical tap, optical drop or gain/loss equalization device. Filter 234 passes the first residual $\lambda_1$ signal and reflects the second residual $\lambda_1$ signal and the signals $\lambda_2-\lambda_n$ which are again received at optical circulator 212. When optoelectronic device 234 is a detector/filter, multiplexer 212 is an optical drop or gain equalization device. Detector/filter 234 detects the first residual $\lambda_1$ signal, passes the first residual $\lambda_1$ signal and reflects a second residual $\lambda_1$ signal and the signals $\lambda_2-\lambda_n$ which are received at optical circulator 212. When optoelectronic device 234 is a laser, multiplexer 212 is an add-drop multiplexer. Laser 234 adds back the signal $\lambda_1$ or adds a new signal, the $\lambda_{n+1}$ signal.

Referring now to FIG. 29, multiplexer 210 of FIG. 28 can further include second optoelectronic device 240 coupled to fifth optical transmission path 236. Second optoelectronic device 240 can be a detector/filter, filter, laser amplifier or attenuator. Multiplexer 212 is an optical tap, optical drop, add-drop multiplexer or gain equalization device when second optoelectronic device is filter 240; an optical drop, gain equalization device, add-drop multiplexer or optical tap when second optoelectronic device is detector/filter 240; and an add-drop multiplexer when second optoelectronic device 240 is laser 12.

In FIG. 29, when detector/filter 234 or filter 234 are coupled to fourth optical transmission path 232, detector/filter 240 detects the second residual $\lambda_1$ signal, passes the second residual $\lambda_1$ signal and reflects a third residual $\lambda_1$ signal and the signals $\lambda_2-\lambda_n$ which are received at optical circulator 212. Filter 240 passes the second residual $\lambda_1$ signal and reflects the third residual $\lambda_1$ signal and the signals $\lambda_2-\lambda_n$ which are again received at optical circulator 212. Laser 240 reflects the second residual $\lambda_1$ signal and the signals $\lambda_2-\lambda_n$, and either adds back the signal $\lambda_1$ or adds a new $\lambda_{n+1}$ signal.

Further in FIG. 29, when laser 240 is coupled to fourth optical transmission path, detector/filter 240 detects the first residual $\lambda_1$ signal, passes the first residual $\lambda_1$ signal and reflects a second residual $\lambda_1$ signal, the signals $\lambda_2-\lambda_n$ and the signal $\lambda_{n+1}$. Filter 240 passes the first residual $\lambda_1$ signal and reflects a second residual $\lambda_1$ signal, the signals $\lambda_2-\lambda_n$ and the signal $\lambda_{n+1}$. Laser 240 reflects the first residual $\lambda_1$ signal, the signals $\lambda_2-\lambda_n$, the signal $\lambda_{n+1}$ and adds back the signal $\lambda_1$ or adds a new signal $\lambda_{n+2}$.

In the embodiment illustrated in FIG. 30, a laser 225 is coupled to second optical transmission path 222. Laser 225 reflects the signals $\lambda_1-\lambda_n$ and adds a signal $\lambda_{+1}$. An optoelectronic device 234 is coupled to fourth optical transmission path 230. Optoelectronic device 234 can be a filter, detector/filter or laser and multiplexer 212 is an add-drop multiplexer or an optical add.

In FIG. 30, when optoelectronic device 234 is a detector/filter 234, detector/filter 234 passes the first residual $\lambda_1$ signal and reflects the second residual $\lambda_1$ signal, the signals $\lambda_2-\lambda_n$, and the signal $\lambda_{n+1}$ which are again received at optical circulator 212. Laser 234 reflects the signal $\lambda_{1-\lambda_n}$, the signal $\lambda_{n+1}$ and adds the $\lambda_{n+1}$ signal, all of which are directed to optical circulator 212.

Figure 31:
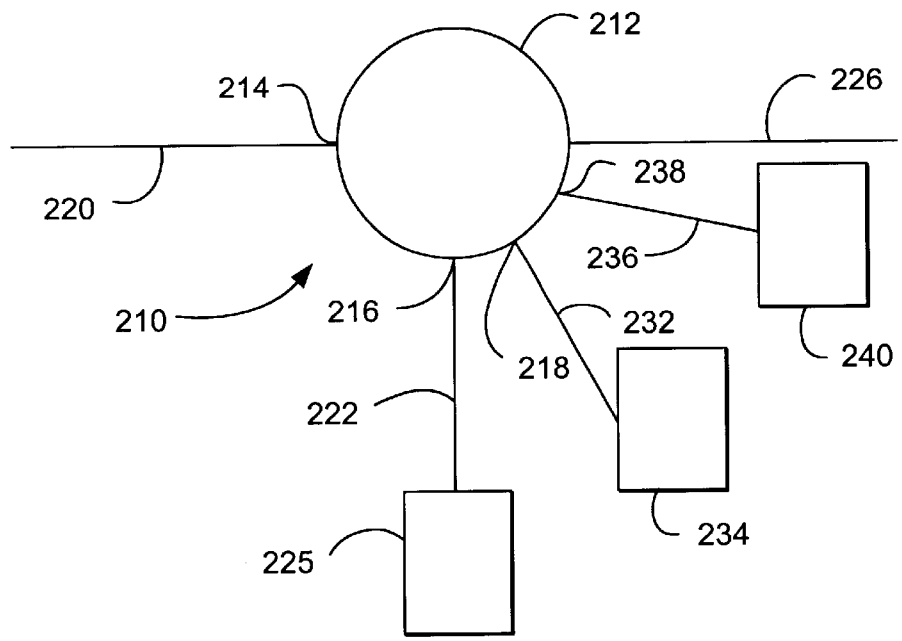
FIG. 31 is a schematic diagram of the multiplexer or de-multiplexer of FIG. 30 with a second optoelectronic device coupled to an additional optical circulator port.

In FIG. 31, multiplexer 210 of FIG. 28 further includes second optoelectronic device 240 coupled to fifth optical transmission path 236. Second optoelectronic device 240 can be a detector/filter, filter or laser 12. When second optoelectronic device is a laser, Laser 240 reflects signals $\lambda_1-\lambda_n$, signal $\lambda_{n+1}$, and signal $\lambda_{n+2}$, and adds a signal $\lambda_{n+3}$. Third optical transmission path 226 transmits signals $\lambda_1-\lambda_n$, signal $\lambda_{n+1}$ the $\lambda_{n+2}$ signal and signal $\lambda_{n+3}$.

Multiple optical circulators are also used with the present invention. As illustrated in FIG. 21, multiplexer 210 includes optical circulator 212 with at least first, second and third circulator ports 214, 216 and 218, and an optical fiber, carrying signals $\lambda_1-\lambda_n$, with a first optical transmission path 220 coupled to first circulator port 214. Second optical transmission path 222 is in optical communication with second circulator port 216. An optoelectronic device 248 is in optical communication with second optical transmission path. A second optical circulator 250 has at least a first, second and third circulator ports 252, 254 and 256 respectively. Third optical transmission path 226 is in optical communication with third circulator port 218 and first circulator port 252. A fourth optical transmission path 260 is in optical communication with second circulator port 254. A second optoelectronic device 262 is in optical communication with fourth optical transmission path 260. A fifth optical transmission path 264 is in optical communication with third circulator port 256. Optoelectronic devices 248 and 262 can be a detector/filter, filter, laser amplifier or attenuator.

In one embodiment, multiplexer 210 is an add-add multiplexer where optoelectronic devices 248 and 262 are lasers 12. Laser 248 adds the signal $\lambda_{n+1}$. Laser 262 adds the signal $\lambda_{n+2}$. Signals $\lambda_1-\lambda_n$, signal $\lambda_{n+1}$ and signal $\lambda_{n+2}$ are transmitted at fifth optical transmission path 264. Signals $\lambda_{n+1}$ and $\lambda_{n+2}$ do not have any particular pre-defined wavelength separation from $\lambda_1$ to $\lambda_n+$. In this configuration wavelengths of arbitrary relationship to $\lambda_1$ to $\lambda_n$ can be flexibly added.

In another embodiment, multiplexer 210 is an add-add multiplexer where optoelectronic devices 248 and 262 are laser 12 and detector/filter 262. Detector/filter 262 detects and passes the signal $\lambda_1$ and reflects the signals $\lambda_2\lambda_n$ and signal $\lambda_{n+1}$. Filter 262 can be substituted for the detector/filter. Filter 262 passes but does not detect the signal $\lambda_1$ and reflects the signals $\lambda_2-\lambda_n$ and signal $\lambda_{n+1}$.

Figure 32:
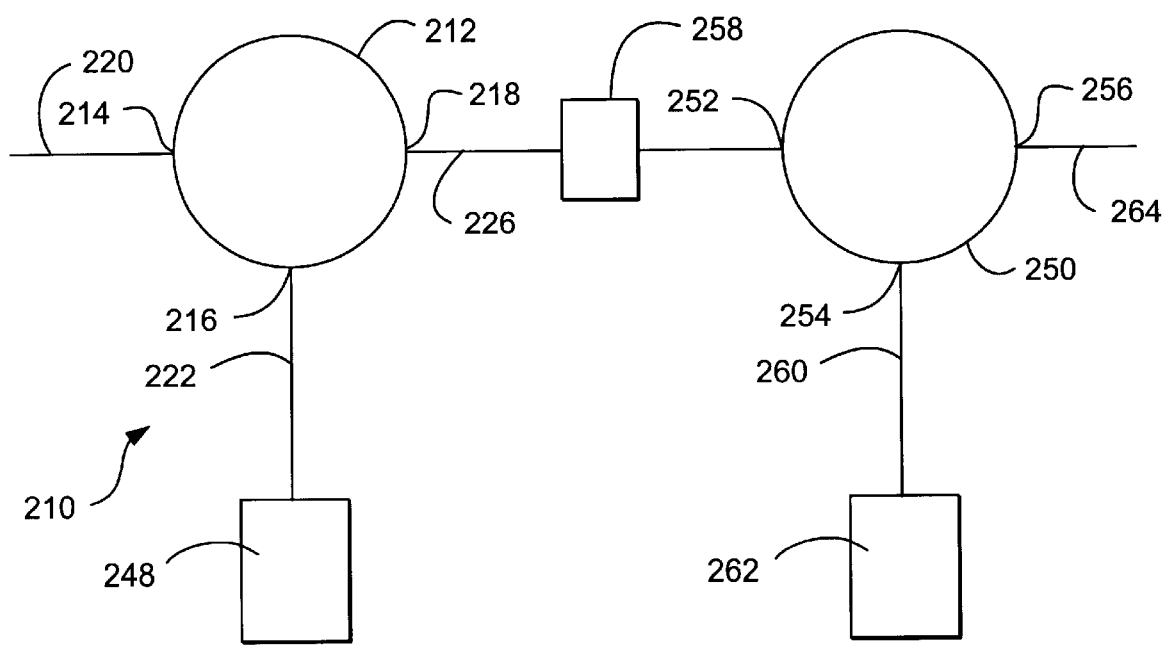
FIG. 32 is a schematic diagram of a multiplexer or de-multiplexer of the present invention with two optical circulators and an optoelectronic device coupled to each optical circulator.

Multiplexer 210 of FIG. 32 can include any number of different combinations of optoelectronic devices to produce a multi-drop multiplexer with low cross-talk. Suitable combinations include but are not limited to detector/filter 248 and detector/filter 262, detector/filter 248 and filter 262, filter 248 and detector/filter 262 as well as filter 248 and filter 262.

Figure 33:
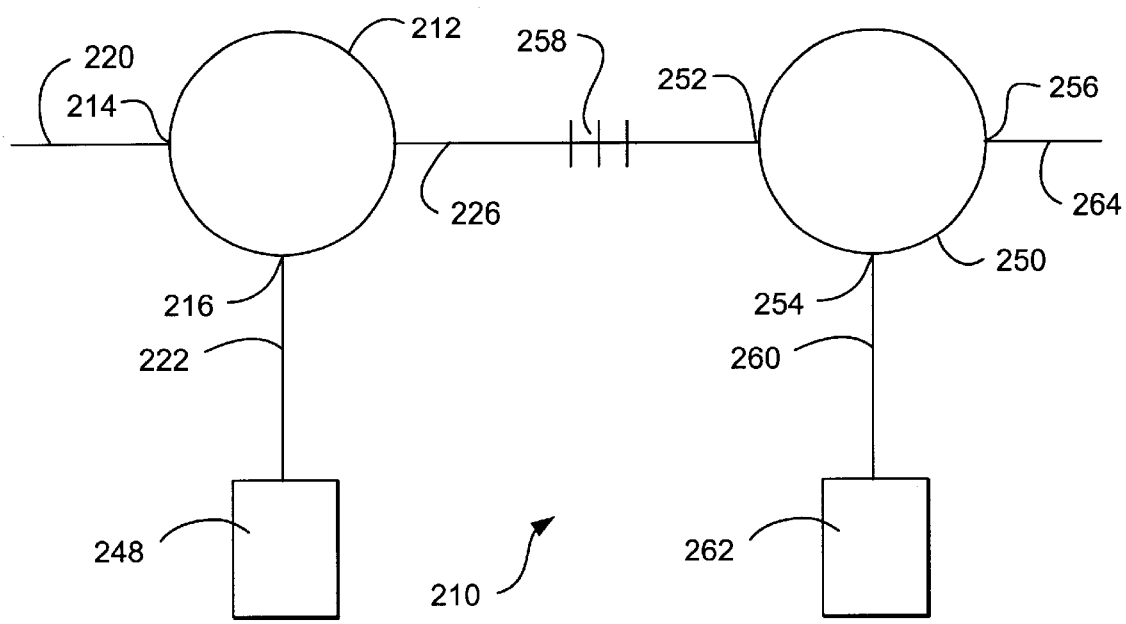
FIG. 33 is a schematic diagram of the multiplexer or de-multiplexer of FIG. 32 that includes a residual filter positioned between the first and second optical circulators.

Referring now to FIG. 33, a rejection filter 258 can be used with the multiplexer of FIG. 32. Rejection filter 258 is coupled to third optical transmission path 226. In this embodiment, multiplexer 210 is an add-drop or a optical drop multiplexer, and optoelectronic device 248 can be a detector/filter or filter, and optoelectronic device 262 can be a detector/filter, filter or laser.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A multiplexer for a wavelength division multiplexed optical communication system, comprising:

an optical circulator including at least a first, second, third and fourth circulator ports;

an optical fiber with a first optical transmission path coupled to the first circulator port of the optical circulator and carrying a wavelength division multiplexed optical signal including signals $\lambda_{1-n}$;

a second optical transmission path in optical communication with the second circulator port;

a first laser coupled to the second optical transmission path, the first laser reflecting the $\lambda_{1-n}$ signals and adding a signal $\lambda_{n+1}$;

a control loop coupled to the first laser, wherein in response to a detected change in temperature the control loop sends signal to adjust a voltage or current supplied to the first laser to provide a controlled frequency and power of an output beam;

a third optical transmission path in optical communication with the third circulator port and transmitting the signals $\lambda_{1-n}$ and the signals $\lambda_{n+1}$ received from the optical circulator;

a fourth optical transmission path in optical communication with the fourth optical circulator port, the fourth optical transmission path being positioned after the second optical transmission path and before the third optical transmission path; and a first optoelectronic device coupled to the fourth optical transmission path.

2. The system of claim 1, further comprising:

a wavelength tuning member coupled to the first laser;

a temperature sensor coupled to the first laser and the control loop, wherein in response to a detected change in temperature the control loop sends an adjustment signal to the tuning member and the tuning member adjusts the voltage or current supplied to the first laser to provide the controlled frequency and power of the output beam.

3. The multiplexer of claim 1, wherein the first optoelectronic device is a second laser, the second laser reflecting the signals $\lambda_{1-n}$ and the $\lambda_{n+1}$ signal and adding a signal $\lambda_{n+2}$, the third optical transmission path transmitting the signals $\lambda_{1-n}$, the $\lambda_{n+1}$ signal and the signal $\lambda_{n+2}$.

4. The multiplexer of claim 3, further comprising:
a fifth optical transmission path in optical communication with a fifth optical circulator port, the fifth optical transmission path being positioned after the fourth optical transmission path and before the third optical transmission path; and
a third laser coupled to the fifth optical transmission path, the third laser reflecting the signals $\lambda_{1-n}$, signal $\lambda_{n+1}$, and signal $\lambda_{n+2}$, and adding a signal $\lambda_{n+3}$, the third optical transmission path transmitting the signals $\lambda_{1-n}$, the signals $\lambda_{n+1}$, the $\lambda_{n+1}$ signal and the signal $\lambda_{n+2}$.

5. The multiplexer of claim 4, wherein the first, second and third lasers are each tunable.

6. The multiplexer of claim 4, wherein the first, second and third lasers are each algorithmically tunable.

7. The multiplexer of claim 1, wherein the first optoelectronic device is a detector/filter, the detector/filter, the detector/filter detecting and dropping a signal $\lambda_1$ and transmitting signals $\lambda_{2-n}$ and the signal $\lambda_{n+1}$.

8. A multiplexer for a wavelength division multiplexed optical communication system, comprising:
a first optical circulator including at least a first, second and third circulator ports;
an optical fiber with a first optical transmission path coupled to the first circulator port of the first optical circulator, the optical fiber carrying a wavelength division multiplexed optical signal including $\lambda_{1-n}$ signals;
a second optical transmission path in optical communication with the second circulator port of the first optical circulator;
a first laser in optical communication with the second optical transmission path;
a control loop coupled to the first laser, wherein in response to a detected change in temperature the control loop sends signal to adjust a voltage or current supplied to the first laser to provide a controlled frequency and power of an output beam;
a second optical circulator including at least a first, second and third circulator ports;
a third optical transmission path in optical communication with the third circulator port of the first optical circulator and the first circulator port of the second optical circulator;
a rejection filter coupled to the third optical transmission path, the rejection filter dropping a signal $\lambda_1$;
a fourth optical transmission path in optical communication with the second circulator port of the second optical circulator;
a first optoelectronic device in optical communication with the fourth optical transmission path; and
a fifth optical transmission path in optical communication with the third circulator port of the second optical circulator.

9. The system of claim 8, further comprising:
a wavelength tuning member coupled to the first laser;
a temperature sensor coupled to the first laser and the control loop, wherein in response to a detected change in temperature the control loop sends an adjustment signal to the tuning member and the tuning member adjusts the voltage or current supplied to the first laser to provide the controlled frequency and power of the output beam.

10. A multiplexer for a wavelength division multiplexed optical communication system, comprising:
a first optical circulator including at least a first, second and third circulator ports;
an optical fiber with a first optical transmission path coupled to the first circulator port of the first optical circulator, the optical fiber carrying a wavelength division multiplexed optical signal including $\lambda_{1-n}$ signals;
a second optical transmission path in optical communication with the second circulator port of the first optical circulator;
a first laser in optical communication with the second optical transmission path, the first laser adding a signal $\lambda_{n+1}$;
a control loop coupled to the first laser, wherein in response to a detected change in temperature the control loop sends signal to adjust a voltage or current supplied to the first laser to provide a controlled frequency and power of an output beam;
a second optical circulator including at least a first, second and third circulator ports;
a third optical transmission path in optical communication with the third circulator port of the first optical circulator and the first circulator port of the second optical circulator;
a fourth optical transmission path in optical communication with the second circulator port of the second optical circulator;
a first optoelectronic device in optical communication with the fourth optical transmission path; and
a fifth optical transmission path in optical communication with the third circulator port of the second optical circulator.

11. The system of claim 10, further comprising:
a wavelength tuning member coupled to the first laser;
a temperature sensor coupled to the first laser and the control loop, wherein in response to a detected change in temperature the control loop sends an adjustment signal to the tuning member and the tuning member adjusts the voltage or current supplied to the first laser to provide the controlled frequency and power of the output beam.

12. The multiplexer of claim 10, wherein the first optoelectronic device is a second laser adding a signal $\lambda_{n+2}$.

13. A multiplexer for a wavelength division multiplexed optical communication system, comprising:
a first optical circulator including at least a first, second and third circulator ports;
an optical fiber with a first optical transmission path coupled to the first circulator port of the first optical circulator, the optical fiber carrying a wavelength division multiplexed optical signal including $\lambda_{1-n}$ signals;
a second optical transmission path in optical communication with the second circulator port of the first optical circulator;
a laser in optical communication with the second optical transmission path, the laser detecting a signal $\lambda_1$ and passing a portion of the signal $\lambda_1$, and reflecting a first residual $\lambda_1$ signal and signals $\lambda_{2-n}$;

a control loop coupled to the laser, wherein in response to a detected change in temperature the control loop sends signal to adjust a voltage or current supplied to the laser to provide a controlled frequency and power of an output beam;

a second optical circulator including at least a first, second and third circulator ports;

a third optical transmission path in optical communication with the third circulator port of the first optical circulator and the first circulator port of the second optical circulator;

a fourth optical transmission path in optical communication with the second circulator port of the second optical circulator;

a first optoelectronic device in optical communication with the fourth optical transmission path, the second optoelectronic device selected from a second detector/filter and a filter; and a fifth optical transmission path in optical communication with the third circulator port of the second optical circulator.

14. The system of claim 13, further comprising:

a wavelength tuning member coupled to the first laser;

a temperature sensor coupled to the first laser and the control loop, wherein in response to a detected change in temperature the control loop sends an adjustment signal to the tuning member and the tuning member adjusts the voltage or current supplied to the first laser to provide the controlled frequency and power of the output beam.

15. The multiplexer of claim 13, wherein the first optoelectronic device is a second detector/filter, the second detector/filter detecting and passing the first residual $\lambda_1$ signal and reflecting a second residual $\lambda_1$ signal and the $\lambda_{2-n}$ signals.

16. The multiplexer of claim 13, wherein the first optoelectronic device is a first filter, the first filter passing the first residual $\lambda_1$ signal and reflecting a second residual $\lambda_1$ signal and the $\lambda_{2-n}$ signals.

* * * * *